US011737368B2

(12) United States Patent
Ouellette et al.

(10) Patent No.: US 11,737,368 B2
(45) Date of Patent: Aug. 22, 2023

(54) MAGNETIC MEMORY DEVICES AND METHODS OF FABRICATION

(71) Applicant: Intel Corporation, Santa Clara, CA (US)

(72) Inventors: Daniel Ouellette, Portland, OR (US); Christopher Wiegand, Portland, OR (US); Justin Brockman, Portland, OR (US); Tofizur Rahman, Portland, OR (US); Oleg Golonzka, Beaverton, OR (US); Angeline Smith, Hillsboro, OR (US); Andrew Smith, Hillsboro, OR (US); James Pellegren, Portland, OR (US); Michael Robinson, Beaverton, OR (US); Huiying Liu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1000 days.

(21) Appl. No.: 16/367,136

(22) Filed: Mar. 27, 2019

(65) Prior Publication Data
US 2020/0313084 A1 Oct. 1, 2020

(51) Int. Cl.
*H10N 50/01* (2023.01)
*H10N 50/10* (2023.01)
*H10B 61/00* (2023.01)
*H10N 50/80* (2023.01)
*H10N 50/85* (2023.01)

(52) U.S. Cl.
CPC ............. *H10N 50/01* (2023.02); *H10B 61/22* (2023.02); *H10N 50/10* (2023.02); *H10N 50/80* (2023.02); *H10N 50/85* (2023.02)

(58) Field of Classification Search
CPC ....... H01L 43/12; H01L 43/08; H01L 27/228; H01L 27/22–228; H01L 43/02
See application file for complete search history.

(56) References Cited

U.S. PATENT DOCUMENTS

| | | | |
|---|---|---|---|
| 2006/0086998 A1* | 4/2006 | Nagaoka | H01L 29/66734 257/500 |
| 2007/0063237 A1 | 3/2007 | Huai et al. | |
| 2012/0292724 A1* | 11/2012 | Lim | H01L 43/08 257/E29.323 |
| 2014/0175582 A1* | 6/2014 | Apalkov | G11C 11/161 257/425 |
| 2017/0345999 A1* | 11/2017 | Noh | H01F 10/16 |
| 2018/0066375 A1* | 3/2018 | Morgan | C25D 17/16 |
| 2018/0240970 A1* | 8/2018 | Oguz | H01L 43/08 |
| 2019/0043548 A1* | 2/2019 | Park | H01L 43/10 |
| 2019/0088713 A1 | 3/2019 | Swerts | |
| 2019/0252601 A1* | 8/2019 | Chatterjee | H01L 27/226 |

(Continued)

*Primary Examiner* — Suberr L Chi
(74) *Attorney, Agent, or Firm* — Essential Patents Group, LLP

(57) ABSTRACT

A memory device includes a first electrode, a conductive layer including iridium above the first electrode and a magnetic junction directly on the conductive layer. The magnetic junction further includes a pinning structure above the conductive layer, a fixed magnet above the pinning structure, a tunnel barrier on the fixed magnet, a free magnet on the tunnel barrier layer and a second electrode above the free magnet. The conductive layer including iridium and the pinning structure including iridium provide switching efficiency.

8 Claims, 13 Drawing Sheets

(56) References Cited

U.S. PATENT DOCUMENTS

| | | |
|---|---|---|
| 2019/0259810 A1 | 8/2019 | Poovannummoottil et al. |
| 2019/0305210 A1* | 10/2019 | Tahmasebi .......... G11C 11/1657 |
| 2019/0374947 A1 | 12/2019 | Shrivastava |
| 2020/0011943 A1 | 1/2020 | Zimmer et al. |
| 2020/0105998 A1* | 4/2020 | Smith ..................... H01L 43/10 |
| 2020/0312907 A1* | 10/2020 | Ouellette ................ H01L 43/08 |
| 2020/0312908 A1* | 10/2020 | Oguz ...................... H01L 43/02 |
| 2020/0313074 A1* | 10/2020 | Smith .................... H01L 27/228 |
| 2020/0313084 A1* | 10/2020 | Ouellette ................ H01L 43/12 |

* cited by examiner

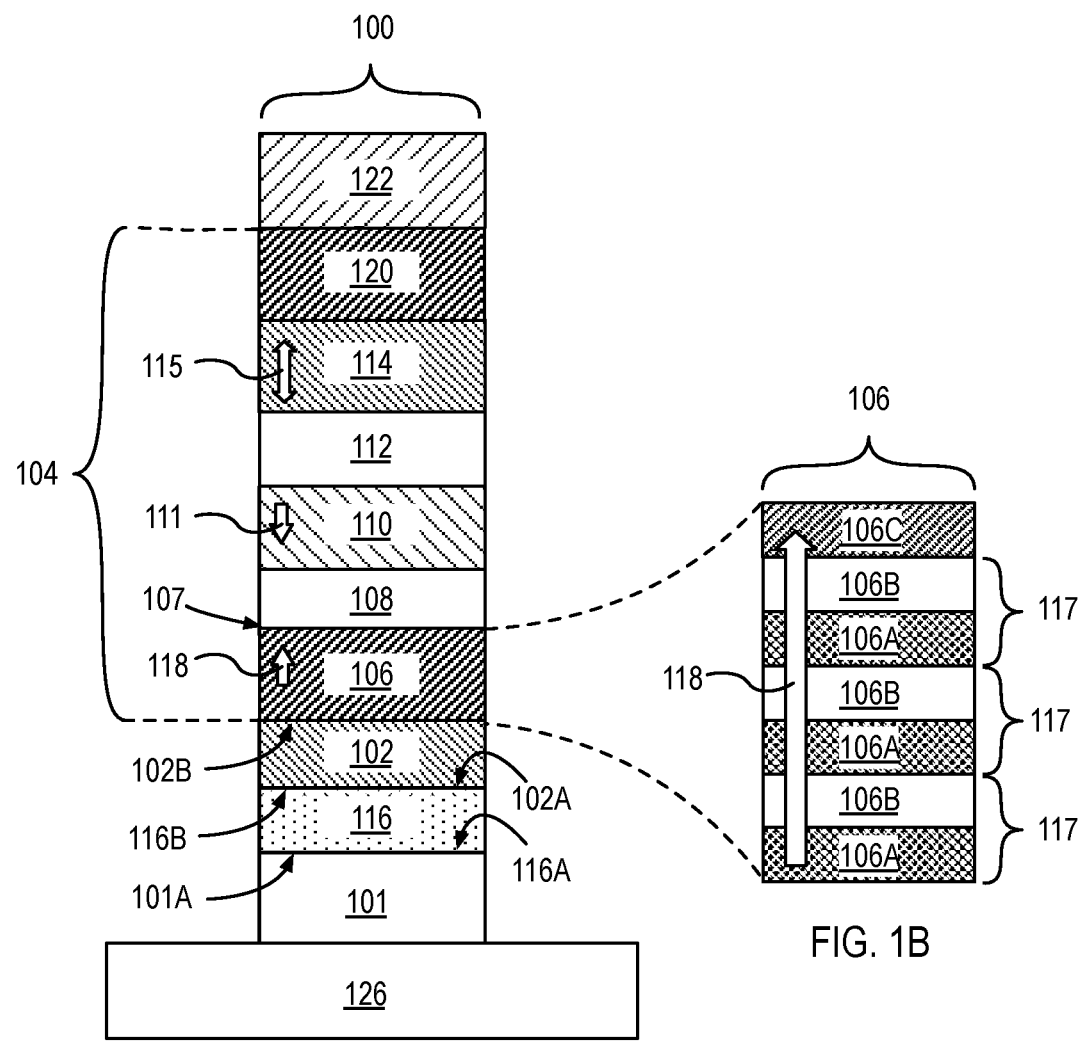
FIG. 1A
FIG. 1B
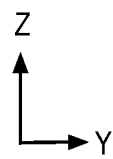

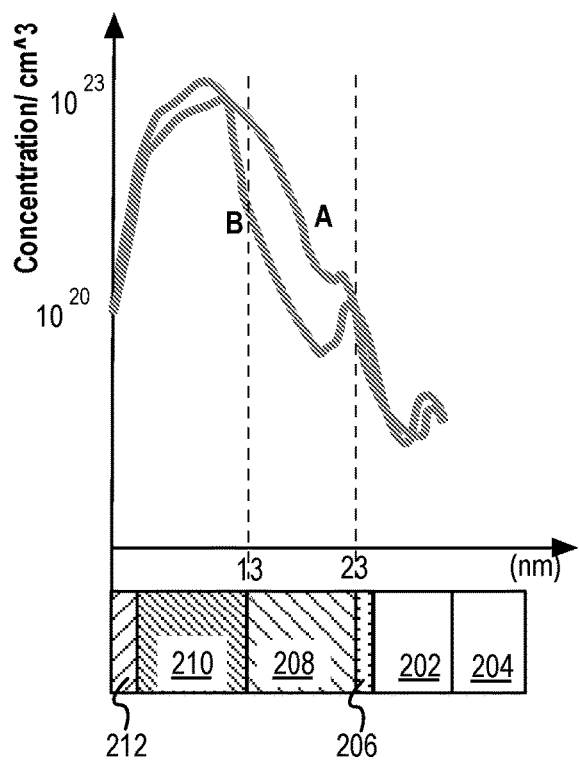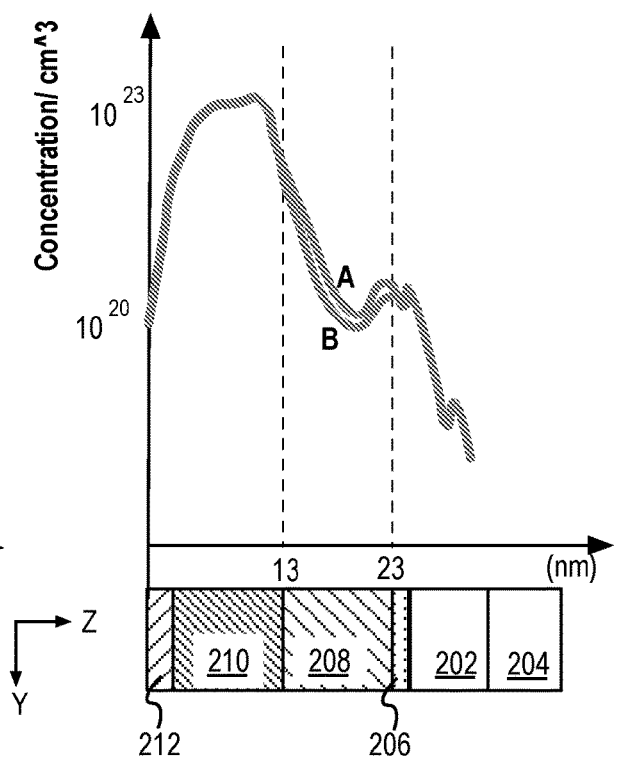
FIG. 2D
FIG. 2E

MAGNETIC MEMORY DEVICES AND METHODS OF FABRICATION

BACKGROUND

For the past several decades, feature size reduction has been a key focus for industrial-scale semiconductor process development. Scaling to smaller dimensions enables a higher density of functional elements per chip, smaller chips, and also reduced cost. However, as the industry approaches the physical limits of traditional scaling, it is becoming increasingly important to look for non-traditional types of devices that can offer new functionality. One such example is non-volatile memory based on a perpendicular magnetic tunnel junction (pMTJ).

Non-volatile embedded memory device with pMTJ, e.g., on-chip embedded memory with non-volatility can enable energy and computational efficiency. However, the technical challenges of assembling a pMTJ stack to form functional devices present formidable roadblocks to commercialization of this technology today. Specifically, enhancing the perpendicular magnetic anisotropy in a pinning magnetic layer that couples with reference magnetic layers is one of the challenges in assembling a viable pMTJ stack.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 1A illustrates a cross-sectional view of a memory device, in accordance with an embodiment of the present disclosure.

FIG. 1B illustrates a cross-sectional view of a plurality of bilayers including a first magnetic layer, a non-magnetic layer on the first magnetic layer capped by a second magnetic layer on non-magnetic layer.

FIG. 2D illustrates plots of platinum through various layers in the stack of FIG. 2A pre and post anneal when a conductive layer in the stack includes platinum.

FIG. 2E illustrates plots of iridium through various layers in the stack of FIG. 2A pre and post anneal when a conductive layer in the stack includes iridium.

DESCRIPTION OF THE EMBODIMENTS

Figures 1C, 1D:
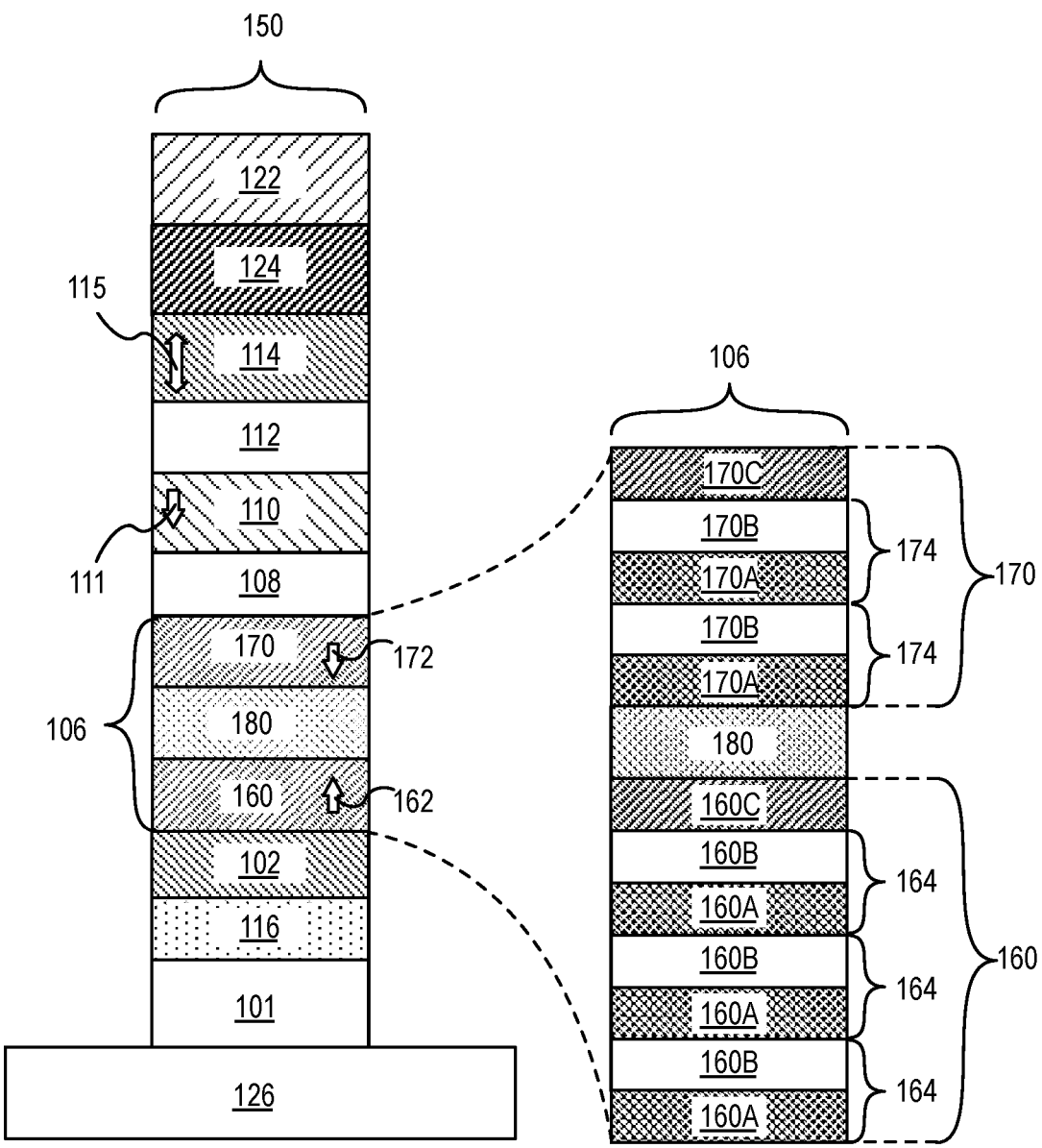
FIG. 1C illustrates a cross-sectional view of a memory device, in accordance with an embodiment of the present disclosure.
FIG. 1D illustrates a cross-sectional view of a memory device, in accordance with an embodiment of the present disclosure.

Perpendicular-MTJ (pMTJ) devices with enhanced tunnel magnetoresistance ratio factor and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Here, an in-plane magnet refers to a magnet that has magnetization in a direction substantially along the plane of the magnet. For example, a magnet with a magnetization which is in an x or y direction and is in a range of 0 (or 180 degrees)+/−20 degrees relative to an x-y plane of a device.

The term "free" or "unfixed" here with reference to a magnet refers to a magnet whose magnetization direction can change along its easy axis upon application of an external field or force (e.g., Oersted field, spin torque, etc.). Conversely, the term "fixed" or "pinned" here with reference to a magnet refers to a magnet whose magnetization direction is pinned or fixed along an axis and which may not change due to application of an external field (e.g., electrical field, Oersted field, spin torque,).

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

An MTJ device functions as a memory device where the resistance of the MTJ device switches between a high resistance state and a low resistance state. The resistance state of an MTJ device is defined by the relative orientation of magnetizations between a free magnet and a fixed magnet, that is separated from the free magnet by a tunnel barrier. When magnetizations of the free magnet and the fixed magnet have orientations that are in the same direction, the MTJ device is said to be in a low resistance state. Conversely, when the magnetization of the free magnet and the magnetization of the fixed magnet are oriented in an opposite direction to each other, the MTJ device is said to be in a high resistance state.

As MTJ devices are scaled, the need for smaller memory elements to fit into a scaled cell size has driven the industry in the direction of perpendicular MTJ (pMTJ). pMTJ based memory devices have a fixed magnet and a free magnet each having a magnetic anisotropy that is perpendicular with respect to a horizontal plane of the free magnet. Resistance switching is brought about in a pMTJ device by passing a threshold spin polarized current through the pMTJ device so as to influence the orientation of the magnetization of the free magnet, aligning it with or against, the magnetization of the fixed magnet. The act of influencing the magnetization in the free magnet is brought about by a phenomenon known as spin torque transfer, where torque from the spin polarized current (from fixed magnet) is imparted to the magnetization of the free magnet. By changing the direction of the spin polarized current through the pMTJ, the direction of magnetization in the free magnet may be reversed relative to the direction of magnetization in the fixed magnet. Since the free magnet does not need a constant source of spin polarized current to maintain a magnetization direction, the resistance state of the pMTJ device is retained even when no current flows through the pMTJ device. For this reason, the pMTJ device belongs to a class of memory known as non-volatile memory.

Because a fixed magnet provides for a spin polarized current and has a magnetization that remains in a fixed orientation there are challenges for selecting materials for the fixed magnet. Typical materials for fixed magnet include cobalt, iron and boron. However, preventing un-intentional changes in magnetization is challenging especially when the fixed magnet is a perpendicular fixed magnet and includes iron. Un-intentional changes in magnetization can result, for example, from diffusion of iron from the fixed magnet. Diffusion of iron from the fixed magnet weakens perpendicular magnetic anisotropy (PMA) which is a source of magnetization in the fixed magnet. Stabilizing and improving PMA can help increase process margins for bit yield, allow for a higher coercivity switching layer, and provide robustness against loss of switching efficiency. Switching efficiency is the magnitude and duration of switching voltage or current pulse utilized to write a bit with a given thermal stability and given tunnel barrier thickness/resistance. Switching efficiency may depend on polarity of switching voltage.

During device operation, a write operation reverses the magnetization in the free layer by spin transfer torque effect. In response there is a back torque on the fixed magnet from the free magnet. A fixed magnet that is sufficiently stable, does not cant or possibly reverse magnetization direction due to back-torque. However, in an absence of a sufficiently stable fixed magnet a greater spin polarized current is required to switch the free layer. An increase in spin polarized current translates to loss of efficiency in device operation as a larger voltage is required to generate a larger spin polarized current (for a given spin polarization).

Stability in magnetization of a fixed magnet can also be improved by coupling the fixed magnet with a pinning magnet structure. The pinning structure is also provided in a memory device to counteract a back-torque effect described above. A pinning structure typically includes platinum and a magnetic material to provide (PMA). The pinning structure can include, for example, a multilayer stack having alternating layers of platinum and magnetic material such as cobalt to provide PMA. In various embodiments, the pinning structure is directly on an intermediate layer (between an electrode and the pinning structure) that has a crystal texture which promotes high quality FCC <111> crystal texture in the pining structure and subsequently in the fixed magnetic layer. An intermediate layer that promotes a high-quality FCC <111> crystal texture in fixed magnetic layer can enhance perpendicular magnetic anisotropy (PMA) of the fixed magnetic layer.

The intermediate layer can include a material such as platinum that has an FCC <111> crystal texture. But platinum also has a strong affinity to combine with iron. When the fixed magnet includes iron, iron can diffuse through the pining structure into the intermediate layer. Diffusion can be enhanced with high temperature anneal, such as temperatures above 300 degrees Celsius. It is desirable for magnetic memory devices to be thermally stable above 350 degrees but prevent diffusion of iron from a perpendicular fixed magnet, and to prevent diffusion of platinum into the perpendicular fixed magnet.

The inventors have found that implementing an intermediate layer including iridium (instead of platinum), iron diffusion from the fixed magnet and in to the intermediate layer can be reduced by a factor of three. An iridium intermediate layer also eliminates an additional source of platinum that can potentially diffuse into the fixed magnet and destroy PMA in the fixed magnet.

Other benefits of iridium intermediate layer include having a sufficient thickness to be continuous and provide a texture having an FCC <111> crystal structure for growth of an FCC magnetic layer immediately above. The presence of iridium at an interface between a magnetic layer in the pinning structure is a source of PMA. The PMA is enhanced because iridium has an FCC <111> crystal structure and is substantially lattice matched with magnetic materials in a lowermost portion of the pinning structure. In some embodiments the intermediate layer including iridium is directly adjacent to a layer of cobalt having an FCC <111> crystal structure in the pinning structure.

In accordance with embodiments of the present disclosure, a memory device includes a first electrode, a conductive layer including iridium above the first electrode and a magnetic junction on the conductive layer. In an embodiment, the magnetic junction includes a magnetic structure having a stack of bilayers, wherein each bilayer includes a magnetic layer including a first magnetic material and a non-magnetic layer on the magnetic layer, capped by another magnetic layer including a second magnetic material. The magnetic junction further includes a fixed magnet, a layer including a metal and oxygen on the fixed magnet. In an embodiment, the magnetic junction is a perpendicular magnetic tunnel junction, and the layer is a tunnel barrier layer. In one embodiment, the tunnel barrier layer includes a material having a <001> crystal texture. For improving TMR ratio, the tunnel barrier and the second magnet are highly crystal matched. The magnetic tunnel junction further includes a free magnet on the tunnel barrier layer. The free magnet has a magnetization which can change in response to torque from a current tunneling through the tunnel barrier layer. The memory device further includes a second electrode above the magnetic junction.

FIG. 1A is an illustration of a cross-sectional view of a memory device 100 in accordance with an embodiment of the present disclosure. The memory device 100 includes a first electrode 101, a conductive layer 102 including iridium above the first electrode 101 and a magnetic tunnel junction (MTJ) 104 on the conductive layer 102. The MTJ 104 includes a magnetic structure 106, a spacer layer 108 on the magnet structure 106, a first magnet 110 having a first magnetization 111 on the spacer layer 108 and a layer 112 including a metal and oxygen on the magnet 110. In the illustrative embodiment, layer 112 is a tunnel barrier 112. In an embodiment, the tunnel barrier has a <001> crystal texture. The MTJ 104 further includes a second magnet 114 on the tunnel barrier 112, where the second magnet 114 has a second magnetization 115.

The conductive layer 102 including iridium has an FCC <111> crystal texture. The iridium is substantially lattice matched to a buffer layer 116 directly below and adjacent to the conductive layer 102. In some embodiments, the conductive layer 102 includes trace amounts of iron having a concentration that varies from an uppermost surface 102A to lowermost surface 102B. In an embodiment, the iron concentration varies by up to 1% where a high concentration is at interface 107 between the magnetic structure 106 and the spacer layer 108. An iron concentration less than 1% is sufficiently low to provide a TMR ratio above 100%. In some embodiments, the conductive layer 102 includes trace amounts of cobalt having a concentration that varies from an uppermost surface 102A to lowermost surface 102B. In an embodiment, the concentration varies by up to 1% where a high concentration is at interface 107 between the magnetic structure 106 and the spacer layer 108. In an embodiment, the conductive layer 102 has a thickness between 0.5 nm and 5 nm. In some exemplary embodiments, the conductive layer 102 has a thickness between 1 nm and 5 nm to be sufficiently continuous.

As discussed above, properties of memory device 100 such TMR ratio and switching voltages are positively impacted by the presence of a conductive layer 102 including iridium compared to a conductive layer including platinum. The inventors have found that a conductive layer 102 including iridium in a memory device 100, has a 10% lower threshold switching voltage than a comparable conductive layer including platinum. Furthermore, a conductive layer including iridium, in a memory device 100, has between 2%-5% higher TMR ratio than a comparable conductive layer including platinum. A higher TMR may be attributed to reduction of iron diffusion into conductive layer 102 and reduction of platinum diffusion into the first magnet 110.

When a conductive layer 102 includes iridium, the difference in mean TMR ratio for thicknesses that range between 1 nm and 3 nm is less than 2%. Similarly, the difference in mean threshold switching voltage when thicknesses in a conductive layer 102 including iridium range between 1 nm and 3 nm is less than 3%.

The crystalline texture of the conductive layer 102 is dependent on the directly adjacent buffer layer 116. In one example, the buffer layer 116 includes TaN, Ta, W, Ru. In another embodiment, the buffer layer 116 includes multilayers including or alloys of TaN, Ta, W, Ru. In such an example, the second buffer layer 116 may be predominantly tungsten. In some such examples, the buffer layer 116 can have a thickness between 0.1 nm and 3 nm. In other embodiments, the buffer layer 116 may have a graded concentration of tungsten, where the percent of tungsten decreases from a lower most surface 116A to an uppermost surface 116B. In some such embodiments the lower most portions of the buffer layer 116 is between 20% and 40% tungsten. In other examples, the buffer layer 116 has a composition that is no more than 50% tungsten and a balance that is substantially ruthenium. In some such embodiments, the buffer layer 116 has a thickness that is less than 5 nm.

The first magnetic structure 106 may include a single magnetic structure having a stack of layers or at least two magnetic structures separated by an antiferromagnetic coupling layer. The magnetic structure 106 may be herein referred to as pinning structure 106.

FIG. 1B illustrates cross-sectional view of a pinning structure 106 in an accordance of an embodiment of the present disclosure. In an embodiment, pinning structure 106 includes a stack of bilayers 117 where each bilayer 117 includes a layer of magnetic metal 106A and a layer of non-magnetic metal 106B on the layer of magnetic metal 106A. In an embodiment, the magnetic metal 106B includes Co or Ni and the non-magnetic metal 106B includes Pd, Pt, W or Mo. In an embodiment, the layer of magnetic metal 106A includes cobalt and the layer of non-magnetic metal 106B includes platinum. In an embodiment, the layer of magnetic metal 106A has a thickness between 0.2 nm and 0.8 nm, and the non-magnetic metal has at thickness between 0.2 nm and 0.8 nm. The number of bilayers 117 may range between 3-12.

The stack of bilayers 117 is capped by a layer of magnetic material 106C. In an embodiment, 106C includes Co, Ni, CoFeB, CoFe, Fe or FeB. In some embodiments, the layer of magnetic material 106C is the same as the layer of magnetic material 106A. In other embodiments, magnetic material 106C is different from the layer of magnetic material 106A. In an embodiment, the layer of magnetic material 106C has a thickness between 0.3 nm and 0.7 nm. As shown, the pinning structure 106 has a magnetization 118.

Referring again to FIG. 1A, the spacer layer 108 includes a material that provides anti-ferromagnetic coupling between the pinning structure 106 and the fixed magnet 110. When a spacer layer 108 includes ruthenium or iridium, spacer layer 108 provides anti-ferromagnetic coupling. In some examples, when the spacer layer 108 includes ruthenium, the iridium spacer layer 108 has a thickness that is approximately 0.5 nm or approximately 1.4 nm. In other examples, when a spacer layer 108 includes ruthenium, the ruthenium spacer layer 108 has a thickness of approximately 0.4 nm or approximately 0.8 nm. As shown in FIG. 1A, the pinning structure 106 has a magnetization 118 that is oppositely directed to the magnetization 111 in the fixed magnet 110. The pinning structure 106 is anti-ferromagnetically coupled with the fixed magnet 110 through the spacer layer 108.

The magnet 110 has a magnetization 111 that remains fixed during operation. Such a magnet 110 is herein referred to as a fixed magnet 110. For example, magnetization 111 may remain substantially fixed in a positive or in a negative Z-direction. In the illustrative embodiment, the magnetization 111 is directed toward a negative Z direction. The direction of magnetization 111 is perpendicular to a plane of an uppermost surface 101A of the electrode 101. The fixed magnet 110 having a magnetization 111 that is perpendicular to the plane of the uppermost surface 101A may also be known as a perpendicular fixed magnet 110.

The chemical composition of the magnet 110 may vary depending on the embodiment. In an embodiment, the fixed magnet 110 includes magnetic materials and has a thickness for sufficiently perpendicular magnetization. In an embodiment, the magnet 110 of the MTJ 104 can include alloys such as CoFe, CoFeB, FeB. The alloys of CoFe, CoFeB, FeB may include doping with one or more of Ta, Hf, Mo, Ir, Ru, Si or C, to promote high perpendicular anisotropy. Alternatively, the alloys of CoFe, CoFeB, FeB may include thin layers of Ta, W or Mo directly adjacent to spacer layer 108 to or to enable transition in crystal texture in the magnet 110 from FCC <111> to BCC <001>. In an embodiment, the magnet 110 comprises a $Co_{100-x-y}Fe_xB_y$, where X and Y each represent atomic percent, further where X is between 50-80 and Y is between 10-40, and further where the sum of X and Y is less than 100. In one specific embodiment, X is 60 and Y is 20. In an embodiment, the magnet 110 is FeB, where the concentration of boron is between 10-40 atomic percent of the total composition of the FeB alloy. In some embodiments, the magnet In an embodiment, tunnel barrier 112 includes a material suitable for allowing electron current having a majority spin to pass through tunnel barrier 112, while impeding, at least to some extent, electron current having a minority spin from passing through tunnel barrier 112. Thus, tunnel barrier 112 (or spin filter layer) may also be referred to as a tunneling layer for electron current of a particular spin orientation. In an embodiment, the tunnel barrier 112 includes a material such as, but not limited to, oxygen and at least one of magnesium (e.g., a magnesium oxide, or MgO), or aluminum (e.g., an aluminum oxide such as $Al_2O_3$). In the illustrative embodiment, the tunnel barrier 112 including MgO has a crystal orientation that is (001) and is lattice matched to fixed magnet 110 below the tunnel barrier 112 and free magnet 114 above tunnel barrier 112. In an embodiment, a free magnet 110 including a $Co_{100-x-y}Fe_xB_y$, is highly lattice matched to the tunnel barrier 112 including an MgO. Lattice matching a crystal structure of the free magnet 110 with the tunnel barrier 112 enables a higher tunneling magnetoresistance (TMR) ratio in the MTJ 104. In an embodiment, tunnel barrier 112 is MgO and has a thickness in the range between 1 nm to 2 nm. In exemplary embodiments, where magnets 110 and 116 include CoFeB, MgO is between 0.9 nm and 1.1 nm.

The magnet 114 has a magnetization 115 that may change orientation during operation. Such a magnet 114 is herein referred to as a free magnet 114. For example, magnetization 115 may orient in the positive or negative Z-direction as indicated by the bi-directional arrow. The direction of magnetization 115 is perpendicular to a plane of an uppermost surface 101A of the electrode 101. The free magnet 114, having a magnetization 115 that is perpendicular to the plane of the uppermost surface 101A, may also be known as a perpendicular free magnet 114. When the magnetization 115 is oriented parallel to magnetization 111 the memory device 100 is in a low electrical resistance state. When the magnetization 115 is oriented parallel to magnetization 111 the memory device 100 is in a high electrical resistance state relative to the low electrical resistance state. The difference in electrical resistance between the high and low states ranges between 2 KOhm and 10 KOhm.

In an embodiment, the free magnet 114 includes magnetic materials and has a thickness for sufficiently perpendicular magnetization. In the illustrative embodiment, the free magnet 114 includes a magnetic material such as Co, Ni, Fe or alloys of these materials. In an embodiment, the free magnet 114 includes a magnetic material such as CoB, FeB, CoFe or CoFeB. In some embodiments, the free magnet 114 includes a $Co_{100-x-y}Fe_xB_y$, where X and Y each represent atomic percent, further where X is between 50 and 80 and Y is between 10 and 40, and further where the sum of X and Y is less than 100. In one specific embodiment, X is 60 and Y is 20. In an embodiment, the free magnet 114 is FeB, where the concentration of boron is between 10 and 40 atomic percent of the total composition of the FeB alloy. In an embodiment, free magnet 114 has a thickness between 1 nm and 1.5 nm.

In an embodiment, the MTJ 104 further includes a capping structure 120 on the free magnet 114. Capping structure 120 provides interfacial protection against iron or oxygen diffusion. In an embodiment, the capping structure 120 includes one or more layers to increase perpendicular magnetic anisotropy in the MTJ 104. For example, capping structure 120 may include a dielectric layer (including Mg and O) in contact with the free magnet 114 and a conductive layer (including CoFeB, Ta, Ru or W) on the dielectric layer. In other embodiments, capping structure 120 includes one or more of Ta, Ru or W. Capping structure 120 may have a thickness between 1.5 nm to 3 nm.

In an embodiment, the memory device 100 further includes a second electrode 122 above the free magnet 114. In the illustrative embodiment, the electrode 122 in directly on the capping structure 120. In some examples, electrode 122 includes one or more Ta, TaN or TiN. In an embodiment, the electrode 122 has a thickness between 5 nm and 70 nm. In some embodiments, the electrode 101 includes one or more layers. For example, the one or more layers may include TaN, Ta, W, Ru or TiN. In an embodiment, the electrode 101 includes TiN having a columnar grain boundary.

The memory device 100 may above a substrate 126, as shown. In an embodiment, the substrate 126 includes a suitable semiconductor material such as but not limited to, single crystal silicon, polycrystalline silicon and silicon on insulator (SOI). In another embodiment, substrate 126 includes other semiconductor materials such as germanium, silicon germanium or a suitable group III-N or a group III-V compound. Logic devices such as MOSFET transistors and access transistors and may be formed on the substrate 126. Logic devices such as access transistors may be integrated with memory devices such as memory device 100 including an MTJ 104 to form embedded memory. Embedded memory including memory device 100 and logic MOSFET transistors can be combined to form functional integrated circuit such as a system on chip. In an exemplary embodiment, MTJ 104 is a perpendicular MTJ (pMTJ) 104.

In some examples, the MTJ 104 includes a pinning structure 106 that may also include a first magnetic structure with a first magnetization and a second magnetic structure with a second magnetization separated by an anti-ferromagnetic layer. Such a pinning structure may provide a greater degree of PMA than a single pinning structure illustrated in FIG. 1B.

FIG. 1C illustrates a cross sectional view of a memory device 150 having a pinning structure 106 that includes a magnetic structure 160 and magnetic structure 170 separated by an adjacent spacer layer 180. The magnetic structure 160 has a magnetization 162 and the magnetic structure 170 has a magnetization 172. In the illustrative embodiment, the magnetization 162 is oppositely directed to magnetization 172.

The magnetic structures 160 and 170 may each include a stack of bilayers similar to the stack of bilayers 117 described above. In an embodiment, the pinning structure 106 includes a magnetic structure 160 having a stack of bilayers 164 and a magnetic structure 170 having a stack of bilayers 174 above the magnetic structure 160 such as is illustrated in FIG. 1D.

In an embodiment, the stack of bilayers 164 includes a layer of magnetic material 160A and a layer of non-magnetic material 160B on the layer of magnetic material 160A. In an embodiment, the magnetic material 160A includes Co or Ni and the non-magnetic material 160B includes Pd, Pt, W or Mo. In an embodiment, the layer of magnetic material 160A includes cobalt and the layer of non-magnetic material 160B includes platinum. In an embodiment, the layer of magnetic material 160A has a thickness between 0.2 nm and 0.8 nm, and the non-magnetic material has at thickness between 0.2 nm and 0.8 nm. Although 3 bilayers are shown in the FIG. 1D for illustrative purpose, the number of bilayers 164 may range between 6-12.

The stack of bilayers 164 is capped by a layer of magnetic material 160C. In an embodiment, 160C includes Co, Ni, CoFeB, CoFe, Fe or FeB. In some embodiments, the layer of magnetic material 160C is the same as the layer of magnetic material 160A. In other embodiments, magnetic material 160C is different from the layer of magnetic material 160A. In an embodiment, the layer of magnetic material 160C has a thickness between 0.3 nm and 0.7 nm.

In an embodiment, the stack of bilayers 174 includes a layer of magnetic material 170A and a layer of non-magnetic material 170B on the layer of magnetic material 170A. In an embodiment, the magnetic material 170A includes Co or Ni and the non-magnetic material 170B includes Pd, Pt, W or Mo. In an embodiment, the layer of magnetic material 170A includes cobalt and the layer of non-magnetic material 170B includes platinum. In an embodiment, the layer of magnetic material 170A has a thickness between 0.2 nm and 0.8 nm, and the non-magnetic material has at thickness between 0.2 nm and 0.8 nm. Although 3 bilayers are shown in the FIG. 1D for illustrative purpose, the number of bilayers 174 may range between 2-6.

The stack of bilayers 164 is capped by a layer of magnetic material 170C. In an embodiment, 170C includes Co, Ni, CoFeB, CoFe, Fe or FeB. In some embodiments, the layer of magnetic material 170C is the same as the layer of magnetic material 170A. In other embodiments, magnetic material 170C is different from the layer of magnetic material 170A. In an embodiment, the layer of magnetic material 170C has a thickness between 0.3 nm and 0.7 nm.

In some embodiments, the number of bilayers 164 in magnetic structure 160 is greater than the number of bilayers 174 in the magnetic structure 170. A combined thickness of the magnetic material 160A in all bilayers 164 of magnetic structure 160 may be greater than a combined thickness of the magnetic material 170A in all bilayers 174 of the magnetic structure 170. A combination of greater combined thickness of magnetic materials and a greater number of bilayers may provide a greater magnetic moment in magnetic structure 160 than in magnetic structure 170. An imbalance in magnetic moment between the magnetic structures 160 and 170 is balanced by a magnetic moment of the fixed magnet 110 in the memory device 150. For example, the magnetic structure 170 is ferromagnetically coupled with the fixed magnet 110 and has a combined magnetic moment which is balanced by a magnetic moment in the magnetic structure 160. Balancing of the magnetic moments may prevent stray fields from impacting the fixed magnet 110 during operation.

In some examples, the magnetic material 170A and 160A may be different and have different thicknesses. In other examples magnetic material 170A and 160A, may be the same and have substantially similar thicknesses. In an embodiment, magnetic material 170A and 160A each include cobalt. In some such embodiments, the magnetic material 170A and 160A each include cobalt and have a thickness between 0.2 nm and 0.5 nm.

In some examples, the non-magnetic materials 160B and 170B may be different and have different thicknesses. In other examples non-magnetic materials 160B and 170B may be the same and have substantially similar thicknesses. In an embodiment, non-magnetic materials 160B and 170B each include platinum. In some such embodiments, the non-magnetic materials 160B and 170B each include platinum and have a thickness between 0.2 nm and 0.5 nm.

In an embodiment, the spacer layer 180 includes a material that provides anti-ferromagnetic coupling between the magnetic structure 160 and magnetic structure 170. When a spacer layer 180 includes ruthenium or iridium, spacer layer 180 may provide anti-ferromagnetic coupling for certain thicknesses. In some examples, when spacer layer 108 includes ruthenium, the ruthenium spacer layer 180 has a thickness of approximately 0.5 nm and approximately 1.4 nm to provide anti-ferromagnetic coupling between the magnetic structure 160 and magnetic structure 170. In other examples, when spacer layer 180 includes ruthenium, the ruthenium spacer layer 180 has a thickness of approximately 0.4 nm or approximately 0.9 nm to provide anti-ferromagnetic coupling between the magnetic structure 160 and magnetic structure 170.

In the illustrative embodiment, the memory device 150 includes a spacer layer 108 that provides ferromagnetic coupling between the magnetic structure 170 and the fixed magnet 110. When a spacer layer 108 includes ruthenium or iridium, spacer layer 108 may provide ferromagnetic coupling for certain thicknesses. In some examples, when spacer layer 108 includes ruthenium, the ruthenium spacer layer 180 has a thickness greater than 0.5 nm and less than 1.4 nm to provide ferromagnetic coupling between the magnetic structure 160 and magnetic structure 170. In other examples, when spacer layer 180 includes ruthenium, the ruthenium spacer layer 180 has a thickness greater than 0.4 nm and less than 0.9 nm to provide ferromagnetic coupling between the magnetic structure 160 and magnetic structure 170. In other embodiments, when spacer layer 108 includes tantalum, molybdenum or tungsten, spacer layer 108 may provide ferromagnetic coupling for thicknesses less than or equal to 0.6 nm.

As discussed above there are benefits of a conductive layer 102 which includes iridium rather than platinum directly adjacent to the pinning structure 106.

Figure 2A:
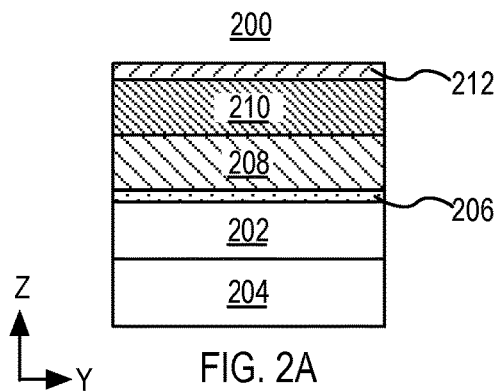
FIG. 2A illustrates a cross-sectional view of a stack including magnetic and non-magnetic layers, in accordance with an embodiment of the present disclosure.

FIG. 2A is a cross sectional illustration of a material layer stack that includes a bottom electrode 202 above a substrate 204, a buffer layer 206 above the electrode 202, a magnet 208 on the buffer layer 206, a conductive layer 210 on the magnet 208 and a top electrode 212 on the conductive layer 210.

In an embodiment, the bottom electrode 202, substrate 204, buffer layer 206, magnet 208 and top electrode 212 each include a material that is the same or substantially the same as the material of the electrode 101, substrate 126, buffer layer 116, magnet 110 and electrode 130, respectively.

In the illustrative embodiment, the material layer stack 200 has the following composition. The bottom electrode 202 includes TiN and has a thickness of approximately 10 nm, the buffer layer 206 includes tungsten and has a thickness of approximately 0.5 nm, the magnet 208 includes cobalt, boron and iron and has a thickness of approximately 10 nm and the top electrode 212 includes W and has a thickness of approximately 3 nm. In one embodiment, the conductive layer 210 includes iridium and in a second embodiment the conductive layer 210 includes platinum.

A chemical analysis of the material layer stack 200 was performed using a secondary ion mass spectroscopic (SIMS) method. The SIMS chemical analysis was performed after deposition of the material layer stack 200 and after annealing at a temperature of approximately 420 degrees.

Figure 2B:
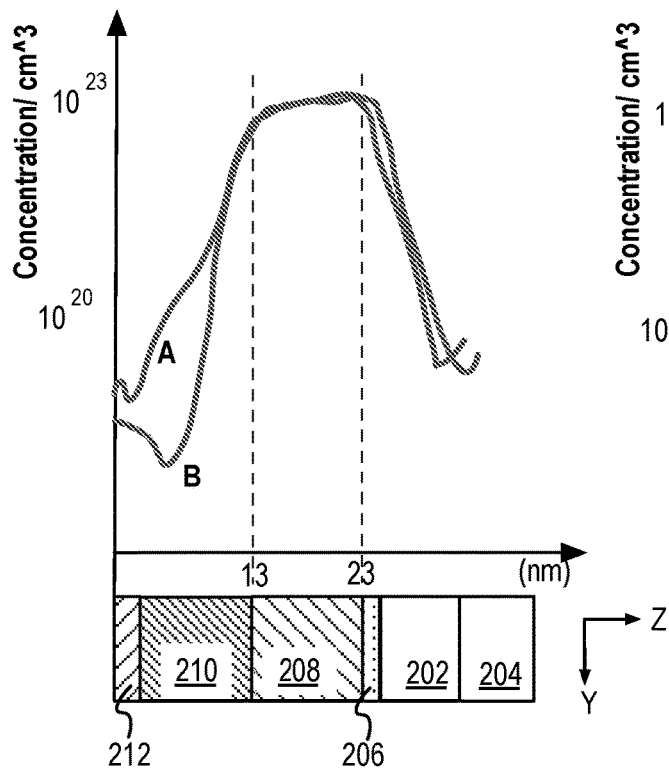
FIG. 2B illustrates plots of iron in various layers in the stack of FIG. 2A pre and post anneal when a conductive layer in the stack includes iridium.

Results of the SIMS chemical analysis performed before and after deposition are plotted in FIG. 2B for a material layer stack where a conductive layer 210 includes iridium. The material layer stack 200 is illustrated on the horizontal axis (depth). The thicknesses (in nm) of the layers in the material layer stack 200 correspond to depth of the SIMS measurement. The vertical axis denotes concentration (number of atoms/cm^3). Line B indicates a concentration of iron as measured through the depth of the material layer stack 200 before annealing. Line A indicates a concentration of iron as measured through the depth of the material layer stack 200 before annealing. After deposition, iron is present in the adjacent conductive layer 210 due to diffusion and intermixing with a material of the conductive layer 210 to the baseline depth resolution of the SIMS method. Before and after annealing, iron has a maximum concentration that is approximately $10^{22}$ in the conductive layer 210 at an interface between the magnet 208 and conductive layer 210, when the conductive layer 210 includes iridium. However, there is a shift in the minimum iron concentration after annealing. Before anneal iron has a minimum concentration that is approximately $0.5 \times 10^{19}$ in the conductive layer 210, when the conductive layer 210 includes Ir. After anneal, the iron concentration rises from a minimum of $0.5 \times 10^{19}$ to approximately $10^{20}$ in the conductive layer 210, due to diffusion of iron and intermixing between iridium and iron in the conductive layer 210 after the high temperature anneal.

Figure 2C:
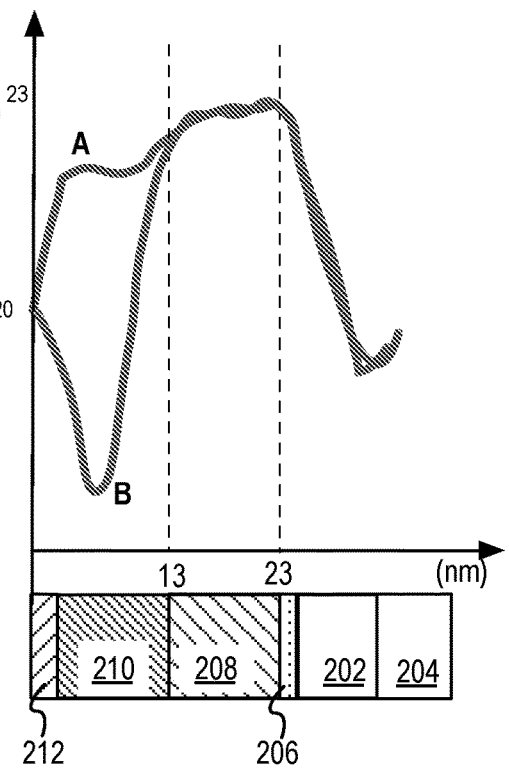
FIG. 2C illustrates plots of iron in various layers in the stack of FIG. 2A pre and post anneal when a conductive layer in the stack includes platinum.

Results of the SIMS chemical analysis performed before and after deposition is plotted FIG. 2C for a material layer stack where a conductive layer 210 includes platinum. The material layer stack 200 is illustrated on the horizontal axis (depth). The thicknesses (in nm) of the layers in the material layer stack 200 correspond to depth of the SIMS measurement. The vertical axis denotes concentration (number of atoms/cm^3). Line B indicates a concentration of iron as measured through the depth of the material layer stack 200 before annealing. Line A indicates a concentration of iron as measured through the depth of the material layer stack 200 before annealing. After deposition iron is present in the adjacent conductive layer 210 due to diffusion and intermixing with a material of the conductive layer 210 to the baseline depth resolution of the SIMS method. Before and after annealing, iron has a maximum concentration that is approximately $10^{22}$ in the conductive layer 210 near an interface between the magnet 208 and conductive layer 210, when the conductive layer 210 includes platinum. However, there is a shift in the minimum iron concentration after annealing. The iron concentration in material layer stack 200, that includes a platinum conductive layer 210, rises from a minimum of $0.5 \times 10^{19}$ to approximately $10^{22}$ in the conductive layer 210, due to diffusion of iron and intermixing between platinum and iron in the conductive layer 210 after the high temperature anneal. It is to be appreciated that diffusion of iron into a layer including Pt may adversely affect the magnetic anisotropy.

The two plots in FIGS. 2B and 2C show that the relative diffusion of iron into the conductive layer 210 including iridium is less than diffusion of iron into conductive layer 210 including platinum by over an order of magnitude. A lower diffusion into a conductive layer 210 including iridium may be due to lower intermixing between iron and iridium compared to intermixing between iron and platinum. In the illustrative embodiment, the magnet 208 has thickness such that the magnetization is in plane (parallel to Y axis). A lower level of iron diffusion from the magnet 208 may preserve in-plane magnetic anisotropy of the magnet 208. In an embodiment, when magnet 208 has a thickness sufficient low (2 nm or less for example), magnet 208 is considered to have a perpendicular anisotropy. In such embodiments, preservation of perpendicular magnetic anisotropy can increase TMR in a memory device.

Results of the SIMS chemical analysis performed before and after deposition is plotted FIG. 2D for a material layer stack where a conductive layer 210 includes platinum. The material layer stack 200 is illustrated on the horizontal axis (depth). The thicknesses (in nm) of the layers in the material layer stack 200 correspond to depth of the SIMS measurement. The vertical axis denotes concentration (number of atoms/cm^3). Line B indicates a concentration of platinum as measured through the depth of the material layer stack 200 before annealing. Line A indicates a concentration of platinum as measured through the depth of the material layer stack 200 after annealing. The platinum concentration peaks within the first 13 nm and decays with depth. After annealing the platinum concentration in the magnet 208 generally is approximately an order of magnitude greater that a platinum concentration in the magnet 208 before annealing, illustrating diffusion of platinum.

Results of the SIMS chemical analysis performed before and after deposition is plotted FIG. 2E for a material layer stack where a conductive layer 210 includes iridium. The material layer stack 200 is illustrated on the horizontal axis (depth). The thicknesses (in nm) of the layers in the material layer stack 200 correspond to depth of the SIMS measurement. The vertical axis denotes concentration (number of atoms/cm^3). Line B indicates a concentration of iridium as measured through the depth of the material layer stack 200 before annealing. Line A indicates a concentration of iridium as measured through the depth of the material layer stack 200 after annealing. The iridium concentration peaks within the first 13 nm and decays with depth. After annealing the iridium concentration in the magnet 208 generally after annealing is substantially the same as the iridium concentration in the magnet 208 before annealing, illustrating very little diffusion of iridium. A substantially similar iridium concentration before and after anneal also illustrates that a high temperature anneal does not cause iridium to diffuse like platinum into the adjacent magnet 208.

Preservation of PMA in a perpendicular magnet can increase TMR in a memory device that includes a thinner (2 nm or less) embodiment of magnet 208. Diffusion of iron from a magnet such as magnet 208 may also adversely affect a pinning structure that includes platinum leading to lower PMA in in the pinning structure.

Figure 3:
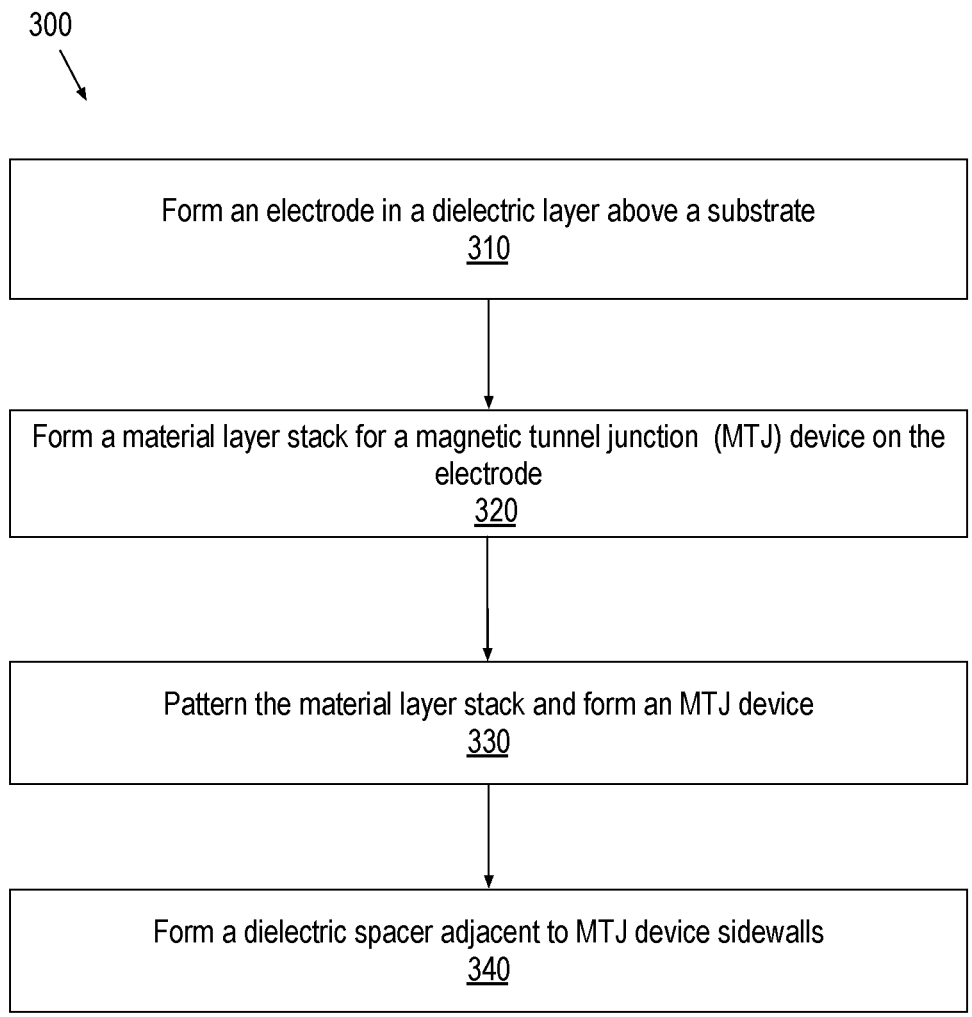
FIG. 3 illustrates a flow diagram of a method to fabricate a memory device.

FIG. 3 illustrates a flow diagram of a method to fabricate a memory device such as the memory device 100. The method 300 begins at operation 310 by forming a bottom electrode above a conductive interconnect formed in a dielectric layer a substrate. The method continues at operation 320 with the formation of an iridium conductive layer having an FCC <111> crystal texture, formation of a pinning magnetic layer having an FCC <111> crystal texture on the seed layer and formation of layers of an MTJ material layer stack. At operation 330, the method 300 involves patterning the material layer stack to form a memory device. The method concludes at operation 340 with formation of a dielectric spacer adjacent to sidewalls of the memory device.

FIGS. 4A-4E illustrate cross-sectional views representing various operations in a method of fabricating a memory device, such as the memory device 100 in accordance with embodiments of the present disclosure.

Figure 4A:
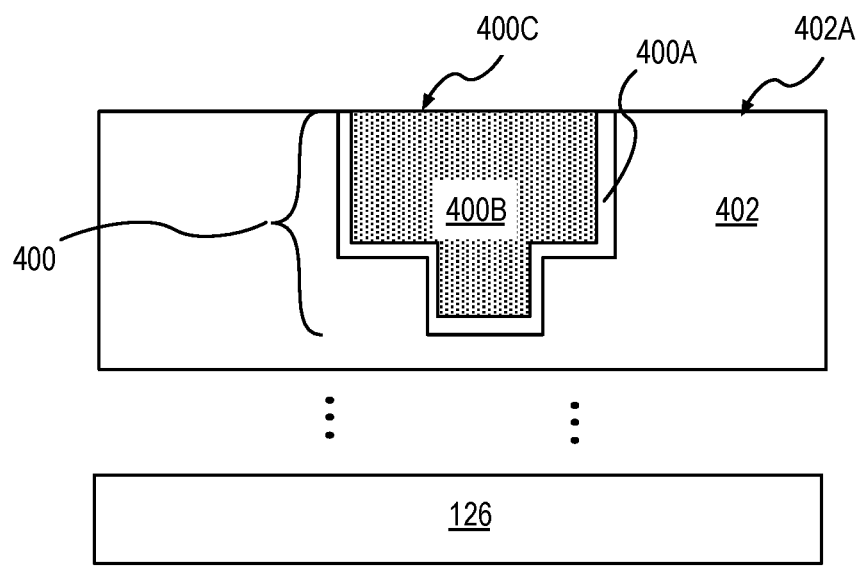
FIG. 4A illustrates a conductive interconnect formed above a substrate.

FIG. 4A illustrates a conductive interconnect 400 formed above a substrate 126. In some embodiments, the conductive interconnect 400 is formed in a dielectric 402, above a substrate 126, such as is shown. In an embodiment, the conductive interconnect 400 includes a barrier layer 400A and a fill metal 400B. In some examples, the barrier layer 400A includes a material such as tantalum nitride or ruthenium. In some examples, the fill metal 400B includes a material such as cobalt, copper or tungsten. In other examples, the conductive interconnect 400 is fabricated using a subtractive etch process when materials other than copper are utilized. In an embodiment, the dielectric 402 includes a material such as but not limited to silicon dioxide, silicon nitride, silicon carbide, or carbon doped silicon oxide. The dielectric 402 may have an uppermost surface 402A that is substantially co-planar with an uppermost surface 400C of the conductive interconnect 400, as is illustrated. In some embodiments, conductive interconnect 400 is electrically connected to a separate circuit element such as a transistor (not shown).

Figure 4B:
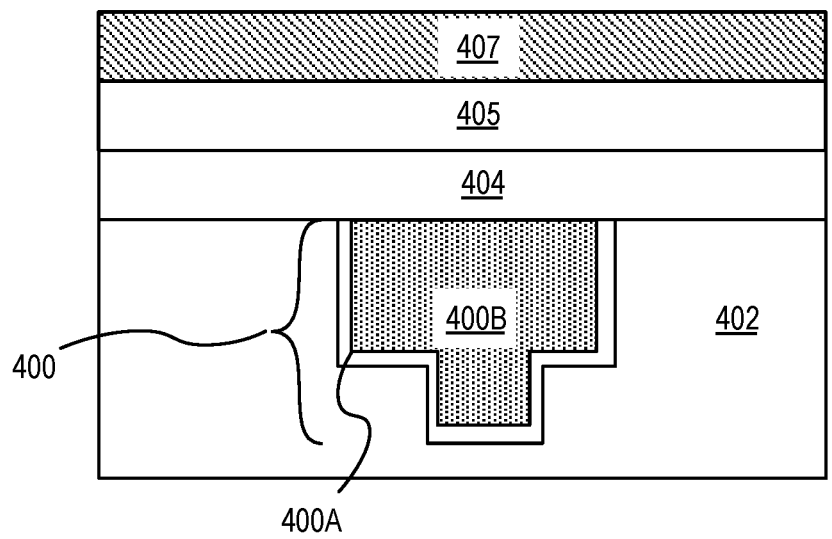
FIG. 4B illustrates the structure of FIG. 4A following the formation of an electrode layer, buffer layer on the electrode layer, a seed layer on the buffer layer.

FIG. 4B illustrates the structure of FIG. 4A following the formation of an electrode layer 404 on the conductive interconnect 400 and over the dielectric 402. In an embodiment, the electrode layer 404 includes a material that is the same or substantially the same as the material of the electrode 101.

A buffer layer 405 is formed on the electrode layer 404. In an embodiment, the buffer layer 405 is formed by reactively co-sputtering tungsten and ruthenium onto the electrode layer 404. Depending on the material composition desired, the atomic percent of tungsten and ruthenium can be controlled during the deposition process. The atomic percent of tungsten and ruthenium can be varied during the deposition process to create an alloy having a gradient in the constituents of the alloy.

In a second embodiment, buffer layer 405 is formed by a deposition process where a thin layer of Ru is deposited onto a thin layer of tungsten, and where the deposition process is continued until a plurality of alternating layers of W and Ru are formed. The resulting material layer stack can be annealed to diffuse and intermix the W and the Ru forming the buffer layer 405. In some such embodiments, the layer of tungsten is between 0.05 nm and 1 nm, and the layer of ruthenium is between 0.05 nm and 1 nm.

In a third embodiment, buffer layer 405 is formed by sputtering an alloyed material from a Ru—W alloy target. In an embodiment, each Ru—W alloy target may have a particular relative atomic percent of W and Ru. In some embodiments, multiple Ru—W alloy targets each with different relative atomic percent of W and Ru may be utilized to deposit a plurality of alloy layers.

In one or more embodiments, deposition of the buffer layer 405 may begin by first depositing a layer of predominantly tungsten and then forming buffer layer 405 on the layer of predominantly tungsten. In some such embodiments, the deposition process further includes depositing a layer of ruthenium on the buffer layer 405, where the ruthenium has a thickness less than 0.5 nm. In or more of the embodiments, the buffer layer 405 has a thickness between 0.5 nm and 10 nm.

A conductive layer 407 is formed on the buffer layer 405. In an embodiment, as discussed above, the alloying of W and Ru changes the crystallographic texture of the buffer layer 405, compared to a layer of predominantly Ru or predominantly W. The crystallographic texture of the buffer layer 405 may enable an iridium conductive layer 407 to be grown with an FCC <111> crystal texture. The iridium conductive layer 407 may be deposited to a thickness between 0.5 nm-5 nm.

Figure 4C:
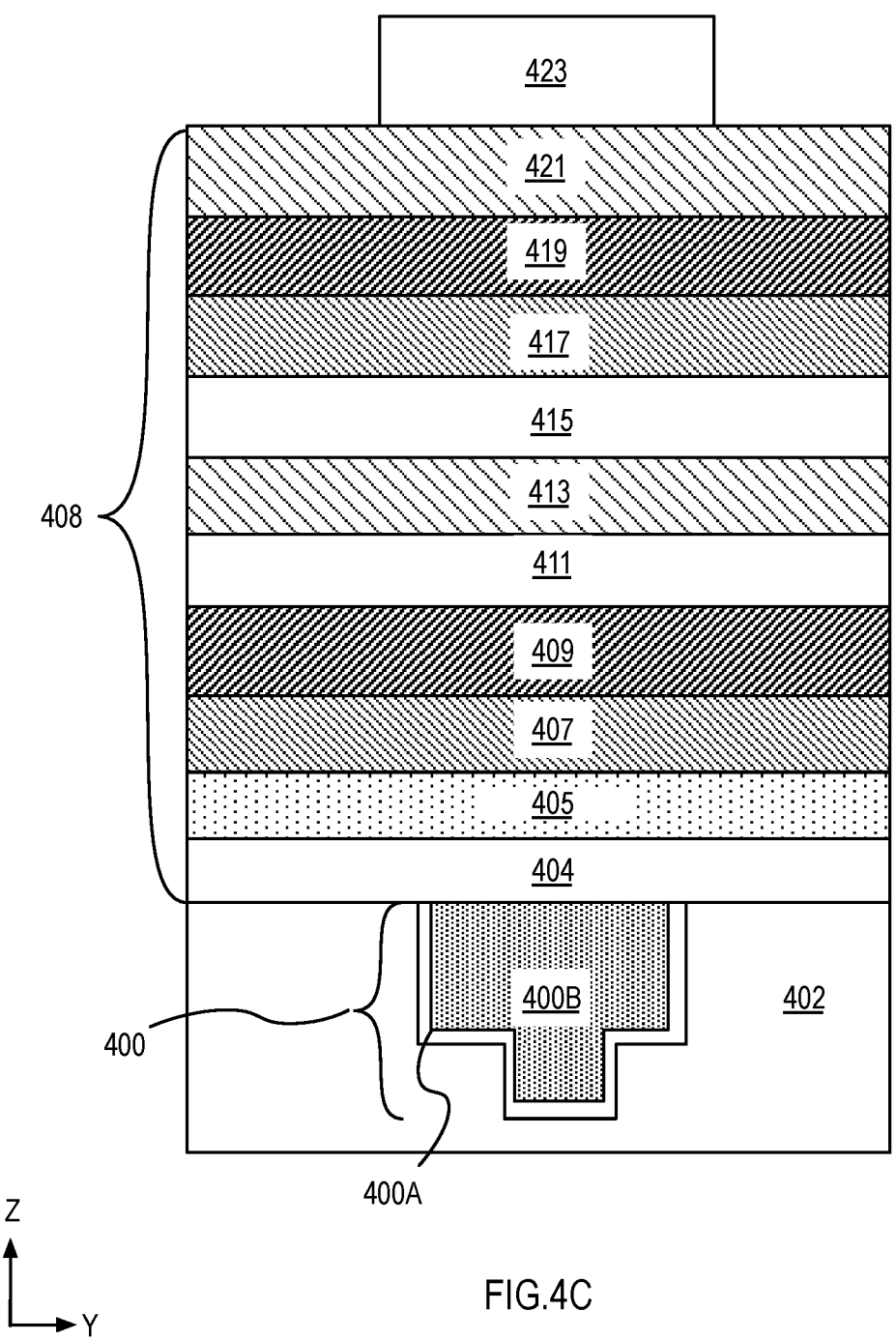
FIG. 4C illustrates a cross-sectional view of the structure in FIG. 4B following the formation of plurality of layers in a material layer stack for a memory device, followed by a mask on the material layer stack.

FIG. 4C illustrates a cross-sectional view of the structure in FIG. 4B following the formation of layers in a material layer stack 408 for a memory device.

In an embodiment, the deposition process continues (after formation of the conductive layer 407 where one or more layers in pinning structure 409 are deposited on the conductive layer 407. In some embodiments, layers in pinning structure 409 are blanket deposited on the conductive layer 407 using a PVD process. In some embodiments, the layers in pinning structure 409 are the same or substantially the same as the layers in pinning structure 106, described above. In an embodiment, the conductive layer 407 including an FCC <111> crystal texture enables a lattice matching with the lowermost layers in pinning structure 409. Such lattice matching enables the formation of fixed magnetic structure with strong perpendicular magnetic anisotropy above the layers in pinning structure 409. Furthermore, a conductive layer 407 grown with reduced strain mismatch enables the lowermost layer in pinning structure 409 to be grown with an increased perpendicular anisotropy.

A coupling layer 411 is formed on an uppermost layer of pinning structure 409. The coupling material 411 includes a material that is the same or substantially the same as the spacer layer 108. The thickness of the coupling material is controlled to provide interlayer coupling between a pinning structure and a fixed magnetic structure to be formed. Depending on the type of pinning structure 106, desired as depicted in FIG. 1B or FIG. 1D, the coupling material 411 may have a material and thickness to provide ferro-magnetic or antiferromagnetic coupling.

The deposition process continues with formation of one or more layers of fixed magnetic material 413 on the coupling layer 411. In an embodiment, the fixed magnetic material 413 includes cobalt, iron and boron that are sputtered using an alloy target in a deposition toolset. In an embodiment, the deposition process includes a physical vapor deposition (PVD) or a plasma enhanced chemical vapor deposition process. In an embodiment, the PVD deposition process includes an RF or a DC sputtering process. In other embodiments, fixed magnetic material 413 includes materials that are the same or substantially the same as the fixed magnet 110.

The deposition process continues with formation of a tunnel barrier layer 415 is blanket deposited on fixed magnetic material 413. In an embodiment, the tunnel barrier layer 415 includes magnesium and oxygen or aluminum and oxygen. In an exemplary embodiment, the tunnel barrier layer 415 is MgO and is deposited using a reactive sputter process. In an embodiment, the reactive sputter process is carried out at room temperature. In another embodiment, the reactive sputter process is carried out at a temperature between 25-350 degrees Celsius. In an embodiment, the tunnel barrier layer 415 is deposited to a thickness between 0.8 nm to 1 nm. In some examples, the deposition process is carried out in a manner that yields a tunnel barrier layer 415 having an amorphous structure. In some such examples, the amorphous tunnel barrier layer 415 becomes crystalline after performing a high temperature anneal process to be described further below. In other embodiments, the tunnel barrier layer 415 is crystalline as deposited.

In an embodiment, a layer of free magnetic material 417 is blanket deposited on an uppermost surface of the tunnel barrier layer 415. In an embodiment, the deposition process includes a physical vapor deposition (PVD) or a plasma enhanced chemical vapor deposition process. In an embodiment, the PVD deposition process includes an RF or a DC sputtering process. In an exemplary embodiment, the free magnetic material 417 is $Co_{100-x-y}Fe_xB_y$, where X and Y each represent atomic percent, further where X is between 50-80 and Y is between 10-40, and further where the sum of X and Y is less than 100. In some embodiments, the free magnetic material 417 includes a material that is the same or substantially the same as the material of the fixed magnet 116 described above. In some examples, the free magnetic material 417 may be deposited to a thickness between 0.9 nm and 2.0 nm. A thickness range between 0.9 nm and 2.0 nm may be sufficiently thin to provide perpendicular magnetic anisotropy required to fabricate a perpendicular MTJ.

In an embodiment, one or more layers in a capping structure 419 are blanket deposited on the surface of the free magnetic layer 413. In an embodiment, the one or more layers in a capping structure 419 include one or more materials described in association with layers in capping structure 120. The one or more layers in capping structure 419 may be deposited using a variety of processes (for example, PVD or PECVD) depending on the layers.

The deposition process concludes with the formation of a top electrode layer 421 on the one or more layers in capping structure 419. The top electrode layer 421 includes a suitable material to provide a hardmask for etching the material layer stack 408. In an embodiment, the top electrode layer 421 includes one or more layers of material such as Ta, TaN or TiN. In an embodiment, an as deposited thickness of the top electrode layer 421 ranges between 40 nm and 70 nm.

In an embodiment, after all the layers in the material layer stack 408 are deposited, an anneal is performed. In an embodiment, the anneal process enables formation of a crystalline alloy of one or more of Co, Fe or B in the free magnetic material 417 and in the fixed magnetic material 413. In an embodiment, the anneal is performed immediately post deposition but before forming a mask 423 on the top electrode layer 421. A post-deposition anneal of the material layer stack 408 is carried out in a furnace at a temperature between 350-440 degrees Celsius in a vacuum environment. In an embodiment, the annealing process promotes solid phase epitaxy of the free magnetic material 417 to follow a crystalline template of the adjacent tunnel barrier layer 415 (e.g., MgO). In an embodiment, the anneal also promotes solid phase epitaxy of the fixed magnetic material 413 to follow a crystalline template of the adjacent tunnel barrier layer 415 (e.g., MgO) <001> Lattice matching between the tunnel barrier layer 415 and the fixed magnetic material 413 and <001> lattice matching between the tunnel barrier layer 415 and the free magnetic material 417 enables a TMR ratio of at least 100% to be obtained in the material layer stack 408.

In an embodiment, the mask 423 defines a shape and size of a memory device and a location where the memory device is to be subsequently formed with respect the conductive interconnect 400. In some embodiments, the mask 423 is formed by a lithographic process. In other embodiments, the mask 423 includes a dielectric material that has been patterned.

Figure 4D:
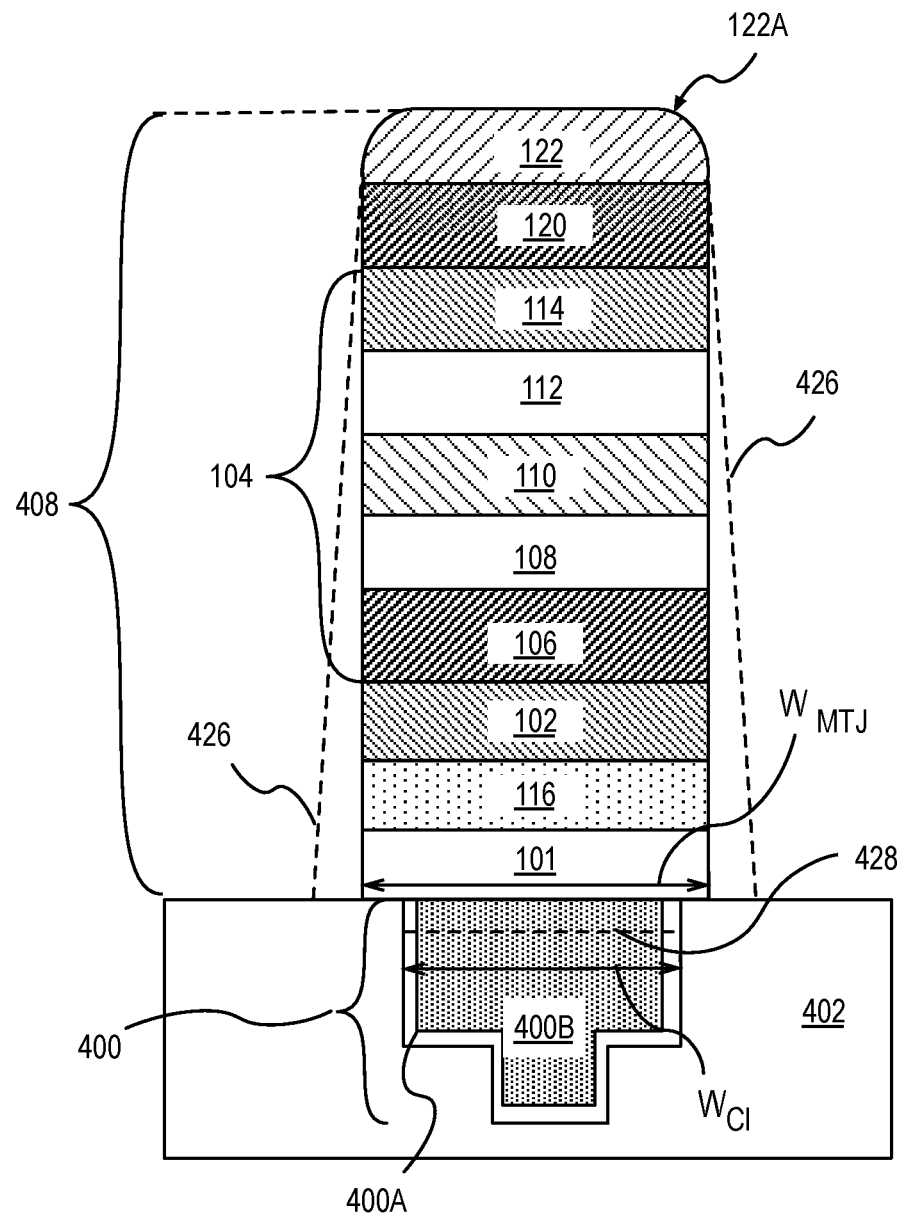
FIG. 4D illustrates a cross-sectional view of the structure in FIG. 4C following the patterning of the material layer stack to form a memory device.

FIG. 4D illustrates a cross-sectional view of the structure in FIG. 4C following the patterning of the material layer stack 408.

In an embodiment, the plasma etch process is utilized to pattern the material layer stack 408 to form a memory device 100. The plasma etch process etches the various layers in the material layer stack 408 to form top electrode 122, capping structure 120, free magnet 114, the tunnel barrier 112, fixed magnet 110, spacer layer 108, pinning structure 106, conductive layer 102, buffer layer 116 and electrode 101.

In an embodiment, the memory device 100 has a width, $W_{MTJ}$, that is greater than a width $W_{CI}$ of the conductive interconnect 400, as shown. In one such embodiment, the plasma etch process exposes the dielectric 402, when the memory device 100 is formed.

In an embodiment, when the memory device 100 has a width, $W_{MTJ}$, that is less than the width $W_{CI}$ of the conductive interconnect 400, the plasma etch process exposes portions of the conductive interconnect 400. In such an embodiment, the bottom electrode may include a cap across a top portion (above dashed line 428, adjacent to the dielectric 402). A cap across the top portion of the conductive interconnect 400 may prevent exposure of the liner layer 400A and the fill metal 400B. A cap may be highly desirable when the fill metal 400B includes copper.

In some embodiments, depending on the etch parameters, and thickness of the various magnetic layers, the memory device 100 may have sidewalls that are tapered as indicated by the dashed lines 426. In other embodiments the plasma etch process may erode mask 423 and erode corners of the top electrode 122. In one such embodiment, the top electrode 122 has a top surface 122A that may have corners that are rounded, as shown in FIG. 4D.

The memory device 100 formed over the conductive interconnect 400, constitutes a memory device 100 with a perpendicular magnetic tunnel junction (pMTJ) 104.

Figure 4E:
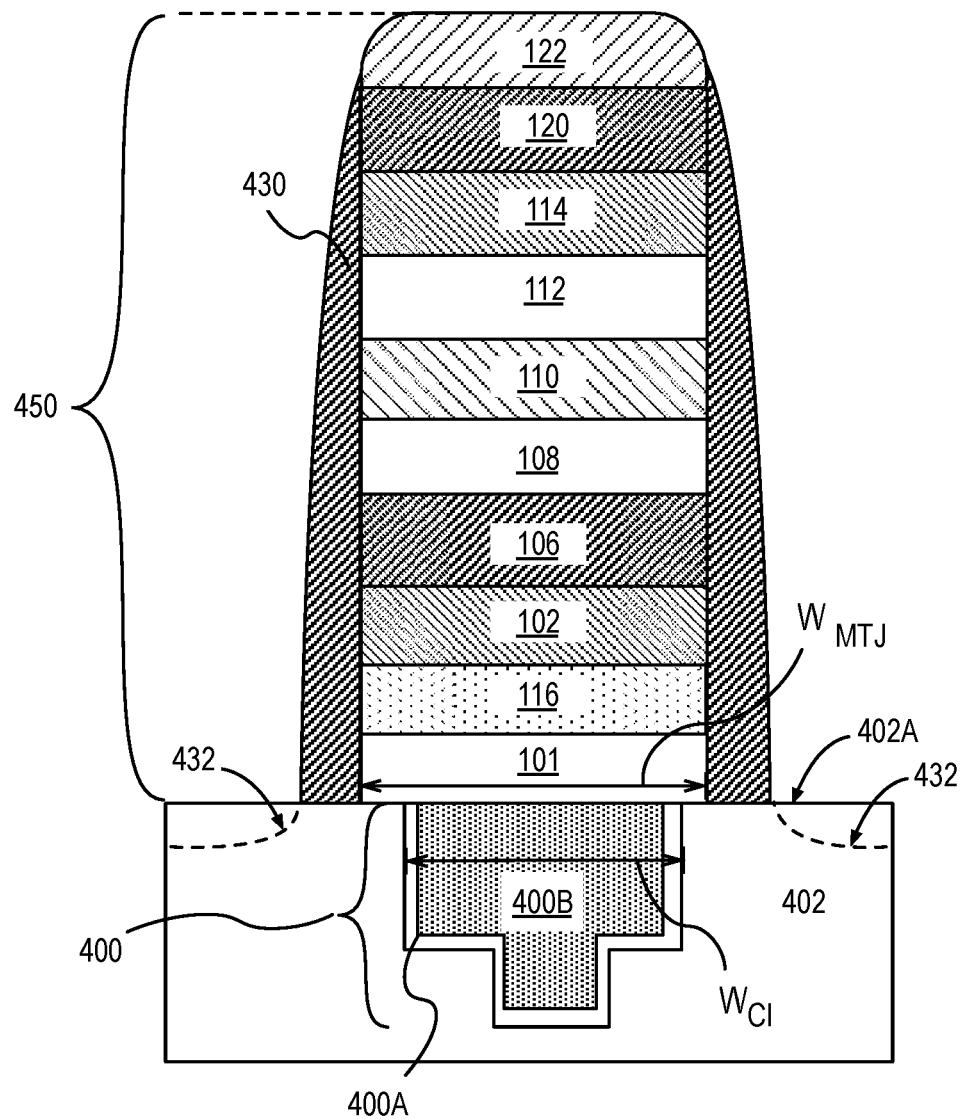
FIG. 4E illustrates a cross-sectional view of the structure in FIG. 4D following the formation of a dielectric spacer adjacent to the memory device.

FIG. 4E illustrates a cross-sectional view of the structure in FIG. 4D following the formation of a dielectric spacer 430 adjacent to the memory device 100. In an embodiment, a dielectric spacer layer is deposited on top surfaces and on sidewalls of the memory device 100 and on the uppermost surface 402A of the dielectric 402 as shown. In examples, when $W_{MTJ}$ is less than $W_{CI}$, the dielectric layer may be also deposited on a portion of a top surface of the conductive interconnect 400 (or on a top surface of a cap discussed in association with FIG. 4D). In an embodiment, the dielectric spacer layer is blanket deposited without a vacuum break following the plasma etch process (described above) to prevent oxidation of magnetic layers in the memory device 100. In an embodiment, the dielectric spacer layer includes silicon and one or more of nitrogen or carbon. Absence of oxygen in the spacer layer may help minimize oxidation of magnetic layers. In an embodiment, the dielectric spacer layer is etched by a plasma etch process forming dielectric spacer 430 on sidewalls of the memory device 100 (as shown). In some embodiments, the dielectric spacer 430 includes materials that are similar or substantially similar to the dielectric 402. In such embodiments, portions of the dielectric 402 may be recessed as indicated by dashed lines 432.

The structure of FIG. 4E including the dielectric spacer 430 on sidewalls of the memory device 100 is herein referred to as memory device 450.

Figure 5A:
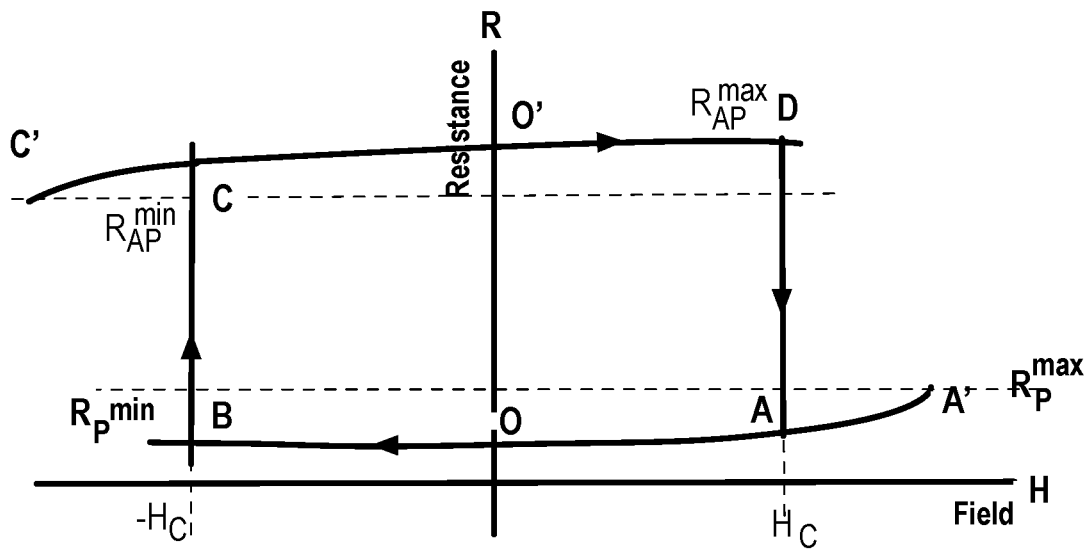
FIG. 5A illustrates a plot of resistance versus magnetic field in a material layer stack for a memory device.

FIG. 5A illustrates a plot of electrical resistance in a memory device (such as a memory device 100 depicted in FIG. 1A) versus an externally applied magnetic field. The plot indicates a change in electrical resistance level in the memory device 100, as the field changes from point A to point B to point C to point D. Corresponding magnetization states in the pinning structure 106, in the fixed magnet 110 and in the free magnet 114 are shown in FIGS. 5B-5F (other structural elements such as electrodes and capping structures are not illustrated for clarity).

Figures 5B, 5C, 5D:
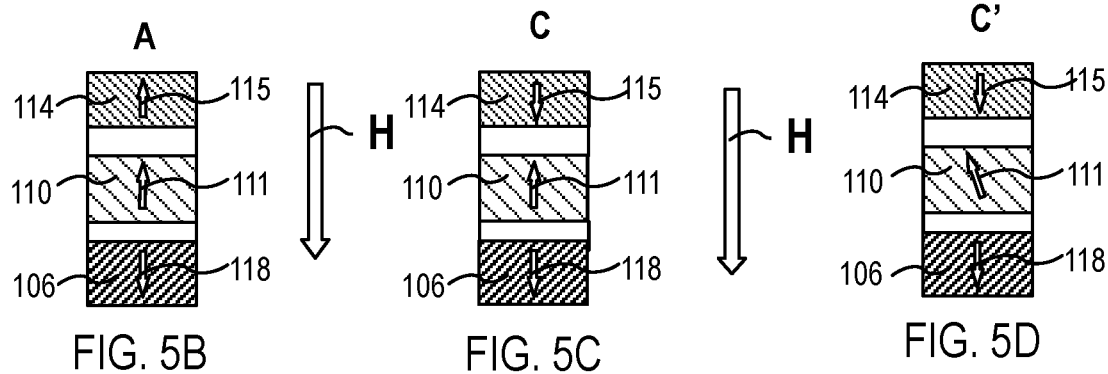
FIG. 5B illustrates magnetizations in various magnetic layers in the material layer stack of FIG. 5A corresponding to a point A on the plot of FIG. 5A.
FIG. 5C illustrates magnetizations in various magnetic layers in the material layer stack of FIG. 5A corresponding to a point C on the plot of FIG. 5A.
FIG. 5D illustrates magnetizations in various magnetic layers in the material layer stack of FIG. 5A corresponding to a point C' on the plot of FIG. 5A.

In an embodiment, at point A, memory device 100 is in a low resistance state (FIG. 5B). Referring to plot in FIG. 5A, as the magnetic field is decreased to 0 at point "O" and then increased in the negative Z-direction, the resistance in memory device 100 increases from approximately $R_p^{max}$ to approximately $R_{AP}^{min}$ (read maximum Parallel resistance to minimum Anti-parallel resistance). There is gradual sloping in resistance in the plot from point A to point B and also between points C and D. However, there is a greater sloping in resistance for fields above +$H_C$ and beyond –$H_C$. It is desirable to reduce resistance sloping within the box ABCD. A measure of the relative slope within box ABCD provides indication of the relative pinning between a pinning structure 106 and fixed magnet 110.

As the field is increased in magnitude (in reverse direction) from point "O" towards point B, there is a resistance change at point B. The resistance in the memory device 100 increases (point C) due to a change in magnetization 115 in the free magnet 114 of the memory device 100. For a corresponding point C in the plot, the magnetization 115 in free magnet 114 is illustrated in FIG. 5C. The magnetization 115 is antiparallel to magnetization 111 in the fixed magnet 110 at point C.

Referring again to FIG. 5A, if the magnetic field H continues to increase in the negative Z direction (point C to C'), the resistance in memory device 100 decreases relative resistance at point C, as shown in the plot. The resistance decreases from C to C' because the magnetic field may cant the magnetization 111 in the fixed magnet 110 away from the positive Z direction as shown in FIG. 5D.

Referring again to FIG. 5A, as the magnitude of the applied magnetic field is reduced (Point C' to O') the resistance changes slightly as the fixed magnet 110 is stably pinned to the pinning structure 106. When the applied magnetic field is increased in magnitude and directed towards the positive Z direction (Point O' to D), magnetization 115 in the free magnet 114 is influenced. In some embodiments, the resistance changes slightly from point O' to point D. The resistance at point D may be characterized by approximately $R_{AP}^{max}$ (read maximum Parallel resistance).

Figures 5E, 5F:
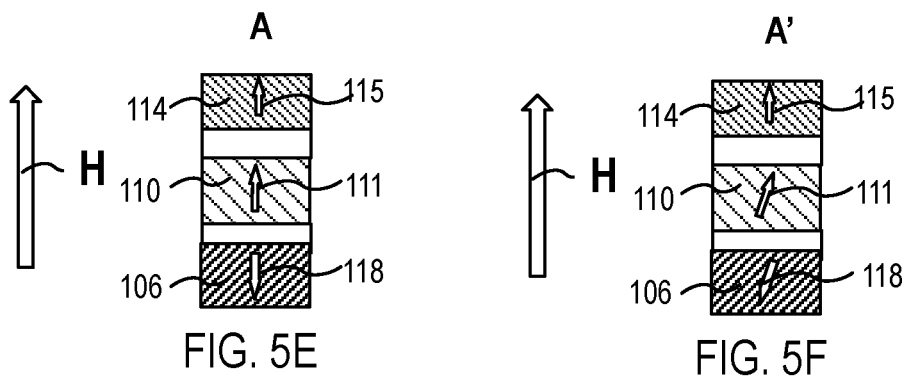
FIG. 5E illustrates magnetizations in various magnetic layers in the material layer stack of FIG. 5A corresponding to a point A on the plot of FIG. 5A.
FIG. 5F illustrates magnetizations in various magnetic layers in the material layer stack of FIG. 5A corresponding to a point A' on the plot of FIG. 5A.

At point D, at a critical magnetic field, $H_C$, there is a resistance change in the memory device 100 and the resistance drops to point A. From point D to point A, the magnetization 115 in the free magnet 114 changes from a configuration depicted in FIG. 5C to a configuration depicted in FIG. 5E. The magnetization 115 in the free magnet 114 aligns with the field and points in the positive Z direction as shown. However, if the applied magnetic field strength continues to increase (keeping the field direction the same), the maximum parallel resistance state in the memory device 100 will increase (at high field magnitude). The maximum parallel resistance (low resistance) starts to increase because increasing the magnetic field strength in a direction opposite to the magnetization 111 direction in the pinning structure 106 can cant the magnetization 118 in the pinning structure 106 as shown in FIG. 5F. Canting in the magnetization 118 can influence the magnetization 111 in the fixed magnet 110 because of magnetic coupling between the fixed magnet 110 and the pinning structure 106. When the magnetization 111 is not completely parallel relative to magnetization 115 in free magnet 114, the maximum parallel resistance starts to increase.

The range between the externally applied field (in negative and positive directions) at which canting occurs provides an indication of how well pinned the fixed magnet 110 is relative to the pinning structure 106. If the fixed magnet 110 is not well pinned, canting can occur at lower magnitudes of the magnetic field.

In the plot illustrated in FIG. 5A, the amount of sloping in the resistance levels between $H_C$ and –$H_C$ is less than 1 percent. In an embodiment, the shape of the R-H curve within $H_C$ and –$H_C$ is substantially flat and may be attributed to an iridium conductive layer and preservation of PMA in the pinning structure 106 and in the fixed magnet 110 of the memory device 100. In an embodiment, a difference in resistance between O' and C' in a memory device 100 (including iridium conductive layer) is less compared to a memory device that includes a conductive layer having platinum for example. Similarly, in an embodiment, a difference in resistance between O' and A in a memory device 100 (including iridium conductive layer) is less compared to a memory device that includes a conductive layer having platinum example.

The inventors have found that an operating voltage needed to switch memory device 100 with an iridium conductive layer 102 is lower compared to an operating voltage needed to switch a memory device 100 having a conductive layer including platinum, for example. It is to be appreciated that the canting effect at high external magnetic field (field greater than $H_C$) is a proxy for a different canting effect which takes place during a spin transfer torque switching write operation in absence of an externally applied magnetic field. During device operation, a write operation reverses the magnetization 115 in the free magnet 114 by spin transfer torque effect. In response there is a back torque on the fixed magnet 110 from the free magnet 114. The pinning structure 106 is provided in a memory device 100 to counteract a back-torque effect. If the pinning structure 106 is sufficiently stable, the fixed magnet 110 does not cant (or possibly reverse magnetization direction) due to the back-torque. However, in an absence of a sufficiently stable fixed magnet 110 a greater spin polarized current is required to switch the free magnet 114. Increase in spin polarized current translates to loss of efficiency in device operation as a larger voltage is required to generate a larger spin polarized current (for a given spin polarization).

Figure 6:
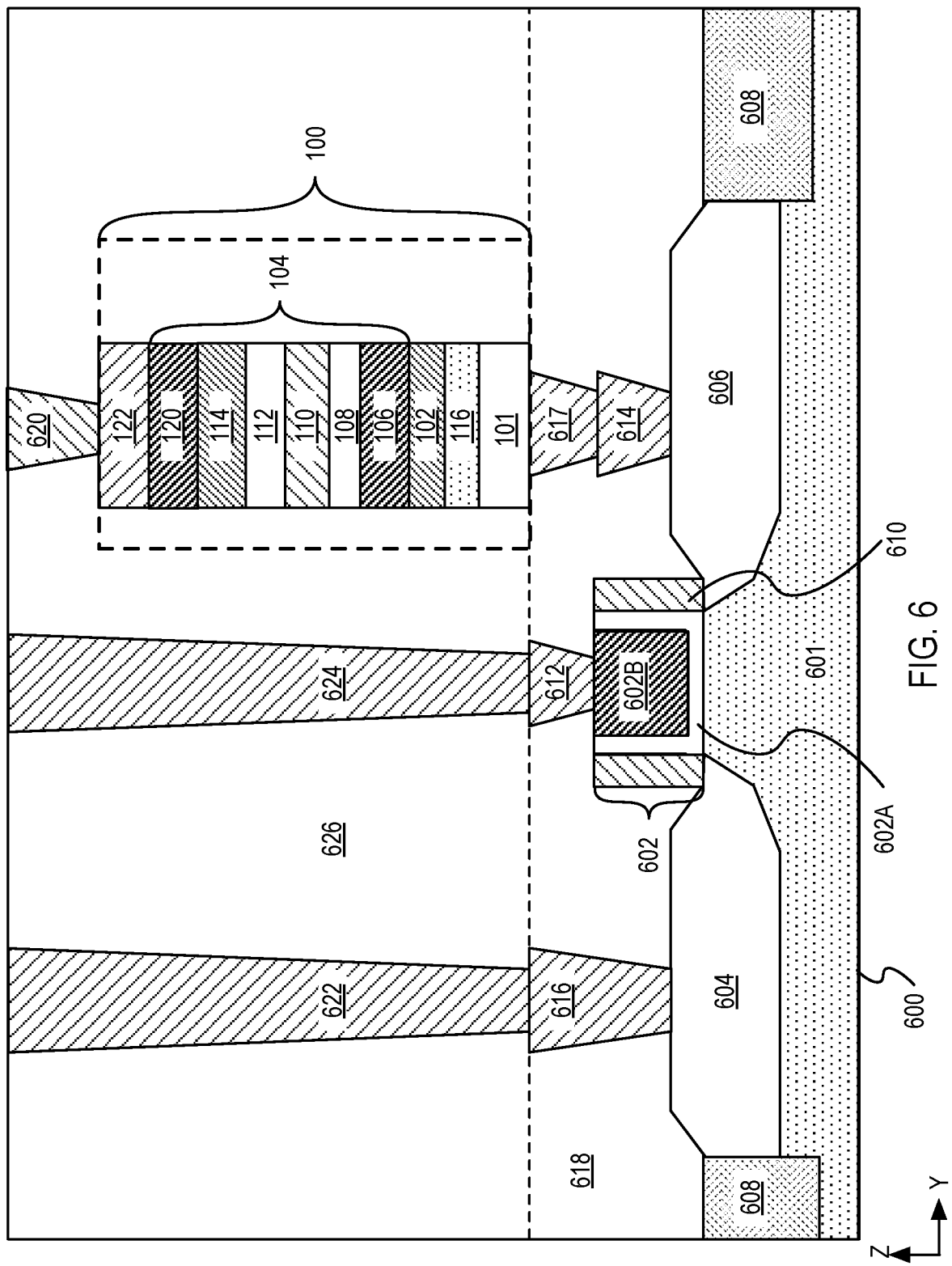
FIG. 6 illustrates a cross-sectional view of a memory device coupled to a transistor.

FIG. 6 illustrates a memory device such as memory device 100 coupled to an access transistor 600. In an embodiment, the transistor 600 is on a substrate 601 and has a gate 602, a source region 604, and a drain region 606. In the illustrative embodiment, an isolation 608 is adjacent to the source region 604, drain region 606 and portions of the substrate 601. In some implementations of the disclosure, such as is shown, a pair of sidewall spacers 610 are on opposing sides of the gate 602.

The transistor 600 further includes a gate contact 612 above and electrically coupled to the gate 602, and a drain contact 614 above and electrically coupled to the drain region 606, and a source contact 616 above and electrically coupled to the source region 604, as is illustrated in FIG. 6. The transistor 600 also includes dielectric 618 adjacent to the gate 602, source region 604, drain region 606, isolation 608, sidewall spacers 610, gate contact 612, drain contact 614 and source contact 616.

In an embodiment, the memory device 100 is a perpendicular memory device 100 with one or more structural and material properties described above in FIG. 1A. The memory device 100 includes electrode 101, conductive layer 102 including iridium above the first electrode 101 and magnetic tunnel junction (MTJ) 104 on the conductive layer 102. The MTJ 104 includes magnetic structure 106, spacer layer 108 on the magnet structure 106, first magnet 110 on the spacer layer 108 and tunnel barrier layer 112 including a metal and oxygen on the first magnet 110. The MTJ 104 further includes a second magnet 114 (such as a free magnet) on the tunnel barrier 112, a capping structure 120 on the second magnet 114 and electrode 122 on the capping structure 120. An MTJ interconnect 620, is coupled with the electrode 122 as shown. MTJ interconnect 620 may be connected to one or more circuit elements. The memory device is above and coupled with conductive interconnect 617 and adjacent to dielectric 618.

In the illustrative embodiment, the conductive interconnect 617 is on and above with the drain contact 614. In the illustrative embodiment, one portion of the electrode 101 is in electrical contact with a drain contact 614 of transistor 600 through the conductive interconnect 617. In other embodiments, there are one or more additional interconnect structures between drain contact 614 and conductive interconnect 617.

In other embodiments, a perpendicular memory device having one or more features of memory device 150 (described in FIG. 1C) may be coupled with the transistor 600.

Gate contact 612 and source contact 616 are each coupled with interconnects. In the illustrative embodiment, gate contact 612 is coupled with a source interconnect 622 and the source contact 616 is coupled with a gate interconnect 624. A dielectric 626 is adjacent to source interconnect 622, gate interconnect 624, memory device 100, source contact 616 and gate contact 612.

In an embodiment, the underlying substrate 601 represents a surface used to manufacture integrated circuits. Suitable substrate 601 includes a material such as single crystal silicon, polycrystalline silicon and silicon on insulator (SOI), as well as substrates formed of other semiconductor materials. In some embodiments, the substrate 601 is the same as or substantially the same as the substrate 126. The substrate 601 may also include semiconductor materials, metals, dielectrics, dopants, and other materials commonly found in semiconductor substrates.

In an embodiment, the transistor 600 associated with substrate 601 are metal-oxide-semiconductor field-effect transistors (MOSFET or simply MOS transistors), fabricated on the substrate 601. In some embodiments, the transistor 600 is an access transistor 600. In various implementations of the disclosure, the transistor 600 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In some embodiments, gate 602 includes at least two layers, a gate dielectric layer 602A and a gate electrode 602B. The gate dielectric layer 602A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 602A to improve its quality when a high-k material is used.

The gate electrode 602B of the access transistor 600 of substrate 601 is formed on the gate dielectric layer 602A and may consist of at least one P-type work function metal or N-type work function metal, depending on whether the transistor is to be a PMOS or an NMOS transistor. In some implementations, the gate electrode 602B may consist of a stack of two or more metal layers, where one or more metal layers are work function metal layers and at least one metal layer is a conductive fill layer.

For a PMOS transistor, metals that may be used for the gate electrode 602B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.6 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.6 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 602B may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode 602B may consist of one or more U-shaped metal layers formed atop one or more planar, non-U-shaped layers.

The sidewall spacers 610 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As shown, the source region 604 and drain region 606 are formed within the substrate adjacent to the gate stack of each MOS transistor. The source region 604 and drain region 606 are generally formed using either an implantation/diffusion process or an etching/deposition process. In the former process, dopants such as boron, aluminum, antimony, phosphorous, or arsenic may be ion-implanted into the substrate to form the source region 604 and drain region 606. An annealing process that activates the dopants and causes them to diffuse further into the substrate typically follows the ion implantation process. In the latter process, the substrate 601 may first be etched to form recesses at the locations of the source and drain regions. An epitaxial deposition process may then be carried out to fill the recesses with material that is used to fabricate the source region 604 and drain region 606. In some implementations, the source region 604 and drain region 606 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 604 and drain region 606 may be formed using one or more alternate semiconductor materials such as germanium or a group III-V material or alloy. And in further embodiments, one or more layers of metal and/or metal alloys may be used to form the source region 604 and drain region 606.

In an embodiment, the source contact 616, the drain contact 614 and gate contact 612 each include a multi-layer stack. In an embodiment, the multi-layer stack includes two or more distinct layers of metal such as a layer of Ti, Ru or Al and a conductive cap on the layer of metal. The conductive cap may include a material such as W or Cu.

In an embodiment, the source interconnect 622 gate interconnect 624, conductive interconnect 617 and MTJ interconnect 620 includes a material that is the same or substantially the same as the material of the conductive interconnect 400 described in association with FIGS. 4A-4E.

The isolation 608 and dielectric 618 and 626 may each include any material that has sufficient dielectric strength to provide electrical isolation. Materials may include silicon and one or more of oxygen, nitrogen or carbon such as silicon dioxide, silicon nitride, silicon oxynitride, carbon doped nitride or carbon doped oxide.

Figure 7:
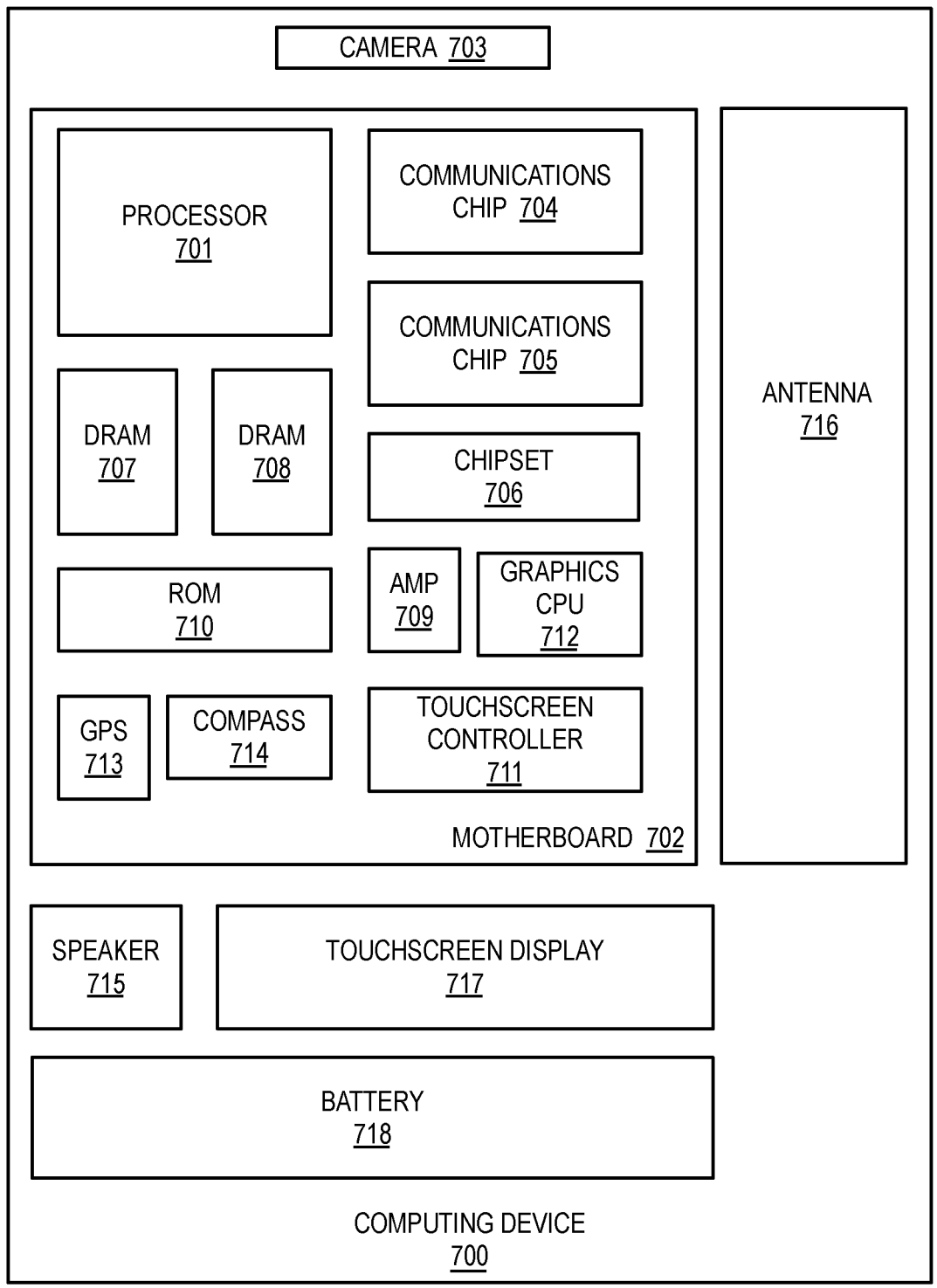
FIG. 7 illustrates a computing device in accordance with embodiments of the present disclosure.

FIG. 7 illustrates a computing device 700 in accordance with embodiments of the present disclosure. As shown, computing device 700 houses a motherboard 702. Motherboard 702 may include a number of components, including but not limited to a processor 701 and at least one communications chip 704 or 705. Processor 701 is physically and electrically coupled to the motherboard 702. In some implementations, communications chip 705 is also physically and electrically coupled to motherboard 702. In further implementations, communications chip 705 is part of processor 701.

Depending on its applications, computing device 700 may include other components that may or may not be physically and electrically coupled to motherboard 702. These other components include, but are not limited to, volatile memory (e.g., DRAM), non-volatile memory (e.g., ROM), flash memory, a graphics processor, a digital signal processor, a crypto processor, a chipset 706, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 705 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 705 may implement any of a number of wireless standards or protocols, including but not limited to Wi-Fi (IEEE 802.11 family), WiMAX (IEEE 802.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 700 may include a plurality of communications chips 704 and 705. For instance, a first communications chip 705 may be dedicated to shorter range wireless communications such as Wi-Fi and Bluetooth and a second communications chip 704 may be dedicated to longer range wireless communications such as GPS, EDGE, GPRS, CDMA, WiMAX, LTE, Ev-DO, and others.

Processor 701 of the computing device 700 includes an integrated circuit die packaged within processor 701. In some embodiments, the integrated circuit die of processor 701 includes one or more transistors, interconnect structures, and non-volatile memory devices such as transistor 600, source interconnect 622, gate interconnect 624, MTJ interconnect 620 and conductive interconnect 400 and memory device 100, respectively (described in FIG. 6). The term "processor" may refer to any device or portion of a device that processes electronic data from registers and/or memory to transform that electronic data into other electronic data that may be stored in registers and/or memory.

Communications chip 705 also includes an integrated circuit die packaged within communication chip 705. In another embodiment, the integrated circuit die of communications chips 704, 705 includes one or more transistors, interconnect structures, and non-volatile memory devices such as transistor 600, source interconnect 622, gate interconnect 624, MTJ interconnect 620 and conductive interconnect 617 and memory device 100, respectively (described in FIG. 6). Depending on its applications, computing device 700 may include other components that may or may not be physically and electrically coupled to motherboard 702. These other components may include, but are not limited to, volatile memory (e.g., DRAM) 707, 708, non-volatile memory (e.g., ROM) 710, a graphics CPU 712, flash memory, global positioning system (GPS) device 713, compass 714, a chipset 706, an antenna 716, a power amplifier 709, a touchscreen controller 711, a touchscreen display 717, a speaker 715, a camera 703, and a battery 718, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 700 and discussed above may contain a stand-alone integrated circuit memory die that includes one or more arrays of NVM devices including one or more memory devices 100 coupled with transistor 600 (described in FIG. 6).

In various implementations, the computing device 700 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
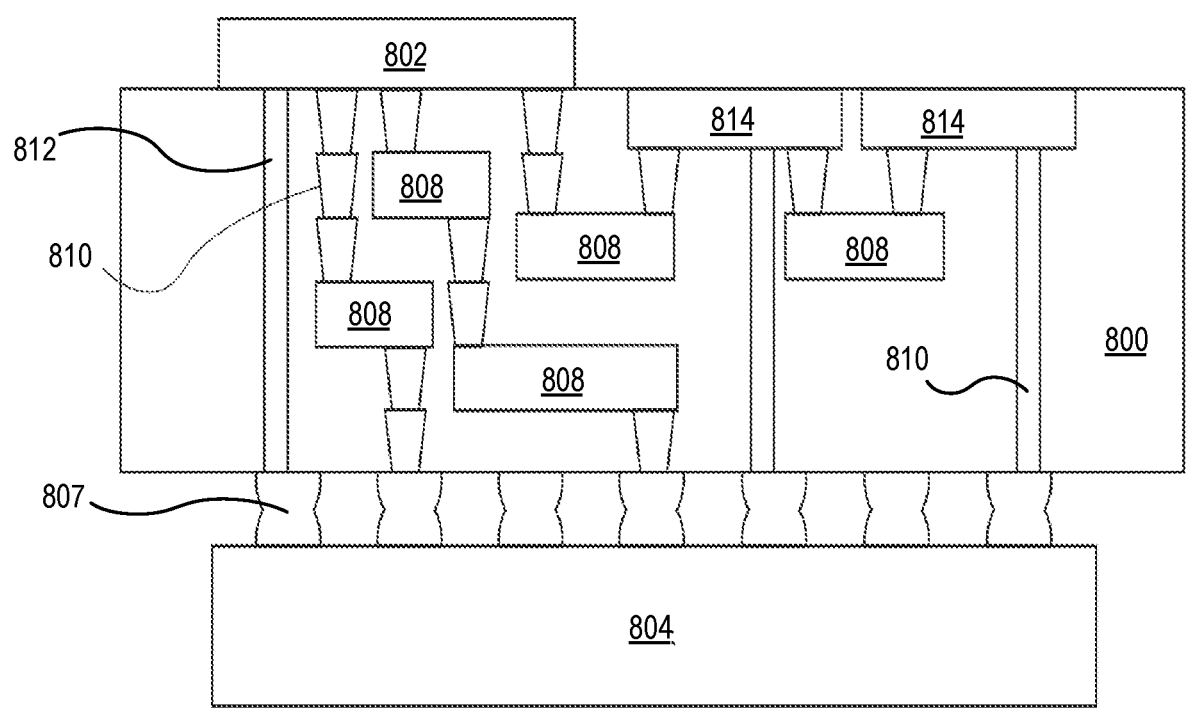
FIG. 8 illustrates an integrated circuit (IC) structure that includes one or more embodiments of the present disclosure.

FIG. 8 illustrates an integrated circuit (IC) structure 800 that includes one or more embodiments of the disclosure. The integrated circuit (IC) structure 800 is an intervening substrate used to bridge a first substrate 802 to a second substrate 804. The first substrate 802 may be, for instance, an integrated circuit die. The second substrate 804 may be, for instance, a memory module, a computer mother, or another integrated circuit die. Generally, the purpose of an integrated circuit (IC) structure 800 is to spread a connection to a wider pitch or to reroute a connection to a different connection. For example, an integrated circuit (IC) structure 800 may couple an integrated circuit die to a ball grid array (BGA) 807 that can subsequently be coupled to the second substrate 804. In some embodiments, the first and second substrates 802/804 are attached to opposing sides of the integrated circuit (IC) structure 800. In other embodiments, the first and second substrates 802/804 are attached to the same side of the integrated circuit (IC) structure 800. And in further embodiments, three or more substrates are interconnected by way of the integrated circuit (IC) structure 800.

The integrated circuit (IC) structure 800 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 808 and vias 810, including but not limited to through-silicon vias (TSVs) 812. The integrated circuit (IC) structure 800 may further include embedded devices 814, including both passive and active devices. Such embedded devices 814 include capacitors, decoupling capacitors, resistors, inductors, fuses, diodes, transformers, device structure including transistors, such as transistor 600 coupled with a with one at least one nonvolatile memory device such as memory device 100 including a conductive layer 102 including iridium (such as described in FIG. 6), in accordance with an embodiment of the present disclosure. The integrated circuit (IC) structure 800 may further include embedded devices 814 such as one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 800. In accordance with embodiments of the present disclosure, apparatuses or processes disclosed herein may be used in the fabrication of integrated circuit (IC) structure 800.

Accordingly, one or more embodiments of the present disclosure relate generally to the fabrication of embedded microelectronic memory. The microelectronic memory may be non-volatile, wherein the memory can retain stored information even when not powered. One or more embodiments of the present disclosure relate to the fabrication of a perpendicular magnetic tunnel junction-based memory device such as the memory device 100. The memory device 100 may be used in embedded non-volatile memory applications.

Thus, embodiments of the present disclosure include memory devices with enhanced magnetic anisotropy and methods of fabrication.

In a first example, a memory device includes a first electrode, a conductive layer including iridium above the first electrode a magnetic junction on the conductive layer and a second electrode above the magnetic junction. The magnetic junction includes a magnetic structure including a stack of bilayers, wherein each bilayer includes a magnetic layer and a non-magnetic layer on the magnetic layer, a spacer layer on the magnet structure, a first magnet with a first magnetization on the spacer layer, a second magnet with a second magnetization, the second magnet above the first magnet and a layer between the first magnet and the second magnet, In second examples, for any of the first example, the conductive layer includes less than 1% atomic percent of iron.

In third examples, for any of the first through second examples, the conductive layer has a thickness between 0.5 nm and 5 nm.

In fourth examples, for any of the first through third examples, the conductive layer has an FCC <111> crystal texture.

In fifth examples, for any of the first through fourth examples, the buffer layer is between the conductive layer and the first electrode, wherein the buffer layer includes one or more of TaN, Ta, W or Ru.

In sixth examples, for any of the first through fifth examples, the magnetic layer includes cobalt and the non-magnetic layer includes platinum.

In seventh examples, for any of the first through sixth examples, the stack of bilayers includes between 2 to 10 bilayers, wherein the magnetic layer is a first magnetic layer, and wherein the magnetic structure further includes a second magnetic layer on the stack of bilayers.

In eighth examples, for any of the first through seventh examples, the spacer layer includes ruthenium, tantalum, tungsten or iridium, and wherein the spacer layer has a thickness between 0.3 nm and 1 nm.

In a ninth example, a memory device includes a first electrode, a buffer layer on the first electrode, a conductive layer including iridium above the first electrode, a magnetic tunnel junction (MTJ) on the conductive layer and a second electrode above the MTJ. The MTJ includes a magnetic structure, where the magnetic structure includes a first magnetic structure including a first stack of bilayers, where each bilayer includes a first magnetic layer and a first non-magnetic layer on the first magnetic layer. The magnetic structure further includes an anti-ferromagnetic layer on the first magnetic structure. The magnetic structure further includes a second magnetic structure including a second stack of bilayers on the layer, where each bilayer includes a second non-magnetic layer and a second non-magnetic layer on the second magnetic layer. The magnetic junction further includes a ferromagnetic layer on the magnet structure, a first magnet with a first magnetization on the spacer layer, a second magnet with a second magnetization, where the second magnet is above the first magnet and a tunnel barrier between the first magnet and the second magnet.

In tenth examples, for any of the ninth example, wherein the conductive layer includes less than 1% atomic percent of iron.

In eleventh examples, for any of the ninth through tenth examples, the conductive layer has a thickness between 0.5 nm and 5 nm.

In twelfth examples, for any of the ninth through eleventh examples, the ferromagnetic layer includes ruthenium, molybdenum, tantalum or tungsten.

In thirteenth example, for any of the ninth through twelfth examples, tantalum and tungsten have thickness less than 0.6 nm.

In fourteenth example, for any of the ninth though thirteenth examples, the anti-ferromagnetic layer includes ruthenium or iridium.

In fifteenth examples, for any of the ninth through fourteenth examples, iridium has a thickness of approximately 0.5 nm or 1.4 nm and ruthenium has a thickness of approximately 0.4 nm or 0.8 nm.

In sixteenth examples, for any of the ninth through fifteenth examples, the first magnetic layer includes cobalt, where the first non-magnetic layer includes platinum, where the first stack of bilayers includes between 6 to 10 bilayers, and where the first magnetic structure further includes a third magnetic layer on the first stack of bilayers.

In seventeenth examples, for any of the ninth through sixteenth examples, the second magnetic layer includes cobalt, where the first non-magnetic layer includes platinum, where the second stack of bilayers includes between 2 to 6 bilayers, and where the second magnetic structure further includes a fourth magnetic layer on the second stack of bilayers.

In eighteenth examples, for any of the ninth through seventeenth examples, the first magnet includes cobalt, iron and boron and the second magnet includes cobalt, iron and boron. The tunnel barrier includes magnesium and oxygen and the memory device further includes a buffer layer including one or more of TaN, Ta, W or Ru between the conductive layer and the first electrode.

In a nineteenth example, a system includes a transistor above a substrate. The transistor includes a drain contact coupled to a drain, a source contact coupled to a source, a gate contact coupled to a gate; and a bottom electrode coupled to the drain contact. The system further includes a memory device coupled with the drain contact, the memory device includes a first electrode, a buffer layer on the first electrode, a conductive layer including iridium above the buffer layer, a magnetic tunnel junction (MTJ) on the conductive layer. The MTJ includes a magnet structure including a first magnetic structure including a first stack of bilayers, where each bilayer includes a first magnetic layer and a first non-magnetic layer on the first magnetic layer. The magnetic structure further includes an anti-ferromagnetic layer on the first magnetic structure and a second magnetic structure including a second stack of bilayers on the layer, where each bilayer includes a second magnetic layer and a second non-magnetic layer on the second magnetic layer. The magnetic junction further includes a ferromagnetic layer on the magnet structure, a first magnet with a first magnetization on the spacer layer, a second magnet with a second magnetization, the second magnet above the first magnet, a tunnel barrier between the first magnet and the second magnet and a second electrode above the MTJ.

In twentieth examples, for any of the nineteenth example, further including a power supply coupled to the transistor.

In a first example, a memory device includes a first electrode, a conductive layer including iridium above the first electrode a magnetic junction on the conductive layer and a second electrode above the magnetic junction. The magnetic junction includes a magnetic structure including a stack of bilayers, wherein each bilayer includes a magnetic layer and a non-magnetic layer on the magnetic layer, a spacer layer on the magnet structure, a first magnet with a first magnetization on the spacer layer, a second magnet with a second magnetization, the second magnet above the first magnet and a layer between the first magnet and the second magnet, In second examples, for any of the first example, the conductive layer includes less than 1% atomic percent of iron.

In third examples, for any of the first through second examples, the conductive layer has a thickness between 0.5 nm and 5 nm.

In fourth examples, for any of the first through third examples, the conductive layer has an FCC <111> crystal texture.

In fifth examples, for any of the first through fourth examples, the buffer layer is between the conductive layer and the first electrode, wherein the buffer layer includes one or more of TaN, Ta, W or Ru.

In sixth examples, for any of the first through fifth examples, the magnetic layer includes cobalt and the non-magnetic layer includes platinum.

In seventh examples, for any of the first through sixth examples, the stack of bilayers includes between 2 to 10 bilayers, wherein the magnetic layer is a first magnetic layer, and wherein the magnetic structure further includes a second magnetic layer on the stack of bilayers.

In eighth examples, for any of the first through seventh examples, the spacer layer includes ruthenium, tantalum, tungsten or iridium, and wherein the spacer layer has a thickness between 0.3 nm and 1 nm.

In a ninth example, a memory device includes a first electrode, a buffer layer on the first electrode, a conductive layer including iridium above the first electrode, a magnetic tunnel junction (MTJ) on the conductive layer and a second electrode above the MTJ. The MTJ includes a magnetic structure, where the magnetic structure includes a first magnetic structure including a first stack of bilayers, where each bilayer includes a first magnetic layer and a first non-magnetic layer on the first magnetic layer. The magnetic structure further includes an anti-ferromagnetic layer on the first magnetic structure. The magnetic structure further includes a second magnetic structure including a second stack of bilayers on the layer, where each bilayer includes a second non-magnetic layer and a second non-magnetic layer on the second magnetic layer. The magnetic junction further includes a ferromagnetic layer on the magnet structure, a first magnet with a first magnetization on the spacer layer, a second magnet with a second magnetization, where the second magnet is above the first magnet and a tunnel barrier between the first magnet and the second magnet.

In tenth examples, for any of the ninth example, wherein the conductive layer includes less than 1% atomic percent of iron.

In eleventh examples, for any of the ninth through tenth examples, the conductive layer has a thickness between 0.5 nm and 5 nm.

In twelfth examples, for any of the ninth through eleventh examples, the ferromagnetic layer includes ruthenium, molybdenum, tantalum or tungsten.

In thirteenth example, for any of the ninth through twelfth examples, tantalum and tungsten have thickness less than 0.6 nm.

In fourteenth example, for any of the ninth though thirteenth examples, the anti-ferromagnetic layer includes ruthenium or iridium.

In fifteenth examples, for any of the ninth through fourteenth examples, iridium has a thickness of approximately 0.5 nm or 1.4 nm and ruthenium has a thickness of approximately 0.4 nm or 0.8 nm.

In sixteenth examples, for any of the ninth through fifteenth examples, the first magnetic layer includes cobalt, where the first non-magnetic layer includes platinum, where the first stack of bilayers includes between 6 to 10 bilayers, and where the first magnetic structure further includes a third magnetic layer on the first stack of bilayers.

In seventeenth examples, for any of the ninth through sixteenth examples, the second magnetic layer includes cobalt, where the first non-magnetic layer includes platinum, where the second stack of bilayers includes between 2 to 6 bilayers, and where the second magnetic structure further includes a fourth magnetic layer on the second stack of bilayers.

In eighteenth examples, for any of the ninth through seventeenth examples, the first magnet includes cobalt, iron and boron and the second magnet includes cobalt, iron and boron. The tunnel barrier includes magnesium and oxygen and the memory device further includes a buffer layer including one or more of TaN, Ta, W or Ru between the conductive layer and the first electrode.

In a nineteenth example, a system includes a transistor above a substrate. The transistor includes a drain contact coupled to a drain, a source contact coupled to a source, a gate contact coupled to a gate; and a bottom electrode coupled to the drain contact. The system further includes a memory device coupled with the drain contact, the memory device includes a first electrode, a buffer layer on the first electrode, a conductive layer including iridium above the buffer layer, a magnetic tunnel junction (MTJ) on the conductive layer. The MTJ includes a magnet structure including a first magnetic structure including a first stack of bilayers, where each bilayer includes a first magnetic layer and a first non-magnetic layer on the first magnetic layer. The magnetic structure further includes an anti-ferromagnetic layer on the first magnetic structure and a second magnetic structure including a second stack of bilayers on the layer, where each bilayer includes a second magnetic layer and a second non-magnetic layer on the second magnetic layer. The magnetic junction further includes a ferromagnetic layer on the magnet structure, a first magnet with a first magnetization on the spacer layer, a second magnet with a second magnetization, the second magnet above the first magnet, a tunnel barrier between the first magnet and the second magnet and a second electrode above the MTJ.

In twentieth examples, for any of the nineteenth example, further including a battery coupled to power at least one of the transistor.

What is claimed is:

1. A memory device, comprising:
   a first electrode;
   a conductive layer comprising iridium and one of iron or cobalt, the conductive layer above the first electrode, wherein a concentration of the iron or the cobalt varies from an uppermost surface to a lowermost surface of the conductive layer;
   a magnetic junction on the conductive layer, the magnetic junction comprising:
      a magnetic structure comprising a stack of bilayers, wherein each bilayer comprises a magnetic layer and a non-magnetic layer on the magnetic layer;
      a spacer layer on the magnetic structure;
      a first magnet with a first magnetization on the spacer layer;
      a second magnet with a second magnetization, the second magnet above the first magnet; and
      a layer between the first magnet and the second magnet; and
   a second electrode above the magnetic junction.

2. The memory device of claim 1, wherein the conductive layer has a thickness between 0.5 nm and 5 nm.

3. The memory device of claim 1, wherein the conductive layer has an FCC <111> crystal texture.

4. The memory device of claim 1, wherein a buffer layer is between the conductive layer and the first electrode, wherein the buffer layer comprises one or more of TaN, Ta, W, or Ru.

5. The memory device of claim 1, wherein the magnetic layer comprises cobalt and the non-magnetic layer comprises platinum.

6. The memory device of claim 1, wherein the stack of bilayers comprises 2 to 10 bilayers, and wherein the magnetic structure further comprises a second magnetic layer on the stack of bilayers.

7. The memory device of claim 1, wherein the spacer layer comprises ruthenium, tantalum, tungsten, or iridium, and wherein the spacer layer has a thickness between 0.3 nm and 1 nm.

8. The memory device of claim 1, further comprising:
   a transistor coupled to the first electrode or the second electrode; and
   a battery coupled to power the transistor.

* * * * *